United States Patent
Naohara et al.

(10) Patent No.: US 10,651,064 B2
(45) Date of Patent: May 12, 2020

(54) SUBSTRATE TREATMENT DEVICE AND SUBSTRATE TREATMENT METHOD

(71) Applicant: SCREEN Holdings Co., Ltd., Kyoto (JP)

(72) Inventors: Hideji Naohara, Kyoto (JP); Hiroaki Kakuma, Kyoto (JP); Yuji Okita, Kyoto (JP); Tatsuya Masui, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 55 days.

(21) Appl. No.: 16/115,757

(22) Filed: Aug. 29, 2018

(65) Prior Publication Data

US 2019/0096720 A1 Mar. 28, 2019

(30) Foreign Application Priority Data

Sep. 25, 2017 (JP) .................. 2017-183516

(51) Int. Cl.
*H01L 21/67* (2006.01)
*G06T 7/00* (2017.01)
*H01L 21/687* (2006.01)

(52) U.S. Cl.
CPC ........ *H01L 21/67253* (2013.01); *G06T 7/001* (2013.01); *G06T 7/0004* (2013.01);
(Continued)

(58) Field of Classification Search
CPC ........ G06T 2207/30148; G06T 7/0004; H01L 21/6708; H01L 21/6715
See application file for complete search history.

(56) References Cited

U.S. PATENT DOCUMENTS

2001/0030294 A1* 10/2001 Iwabuchi .............. G01N 23/20
250/492.3
2001/0033683 A1* 10/2001 Tanaka .................. G06T 7/001
382/149
(Continued)

FOREIGN PATENT DOCUMENTS

JP 2004-060016 A 2/2004
JP 2008-186961 A 8/2008
(Continued)

OTHER PUBLICATIONS

Office Action dated Jul. 2, 2019 and Search Report in counterpart Taiwanese Patent Application No. 107129297 with Japanese translation and partial English translation based on the Japanese translation.
(Continued)

*Primary Examiner* — David Bilodeau
(74) *Attorney, Agent, or Firm* — Ostrolenk Faber LLP

(57) ABSTRACT

A substrate treatment device includes: a substrate rotation part that horizontally holds and rotates a substrate; a nozzle that supplies a treatment liquid to a surface to be treated of the substrate rotated by the substrate rotation part; an imaging part that captures an image of an imaging area including a plurality of target areas in which a liquid film is formed when the treatment liquid is supplied to the substrate; and a detection part that refers to an imaging result of the imaging part and detects a treatment ending time point of each of the target areas based on a change in luminance value for each of the target areas. Further, the imaging area includes at least an area on a center side of the surface to be treated and an area on an outer circumferential side of the surface to be treated as the target areas.

22 Claims, 14 Drawing Sheets

(52) U.S. Cl.
CPC ...... *H01L 21/6708* (2013.01); *H01L 21/6715* (2013.01); *H01L 21/67051* (2013.01); *H01L 21/68764* (2013.01); *G06T 2207/10016* (2013.01); *G06T 2207/30148* (2013.01)

(56) References Cited

U.S. PATENT DOCUMENTS

| | | | | |
|---|---|---|---|---|
| 2011/0293167 | A1* | 12/2011 | Hayashi | G06T 7/0004 |
| | | | | 382/149 |
| 2016/0078612 | A1* | 3/2016 | Kodama | G06T 7/74 |
| | | | | 382/151 |
| 2016/0148366 | A1* | 5/2016 | Amano | G06T 7/0008 |
| | | | | 348/87 |
| 2016/0303829 | A1 | 10/2016 | Arai et al. | |
| 2017/0287147 | A1* | 10/2017 | Takahashi | G06K 9/00771 |
| 2018/0053319 | A1* | 2/2018 | Kakuma | H01L 21/67051 |

FOREIGN PATENT DOCUMENTS

| | | |
|---|---|---|
| JP | 2010-056405 A | 3/2010 |
| JP | 4947887 B2 | 6/2012 |
| JP | 5305792 B2 | 10/2013 |
| JP | 2014-116568 A | 6/2014 |
| TW | M544102 U | 6/2017 |

OTHER PUBLICATIONS

Notification of Reason for Refusal dated Jan. 16, 2020 in corresponding Korean Patent Application No. 10-2018-0103789 with English translation obtained from the JPO.

* cited by examiner

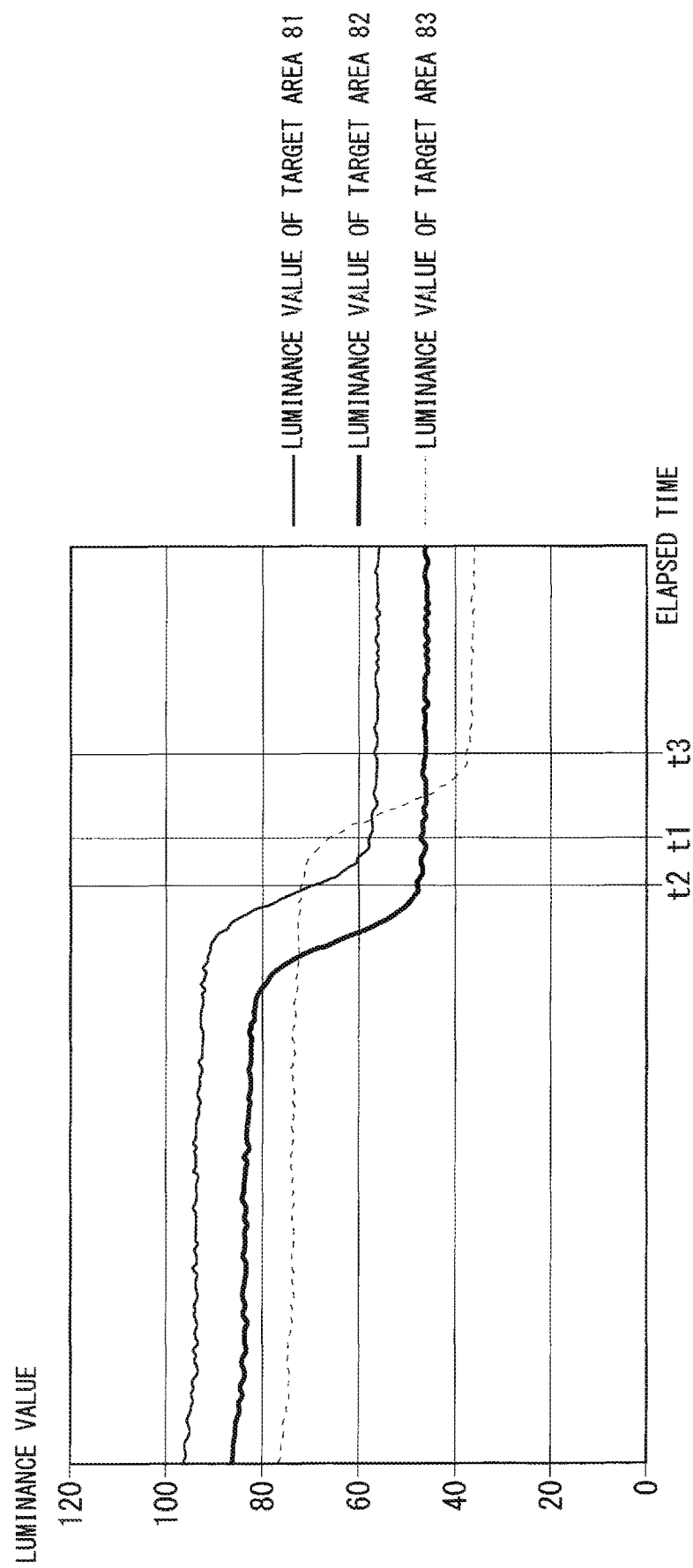

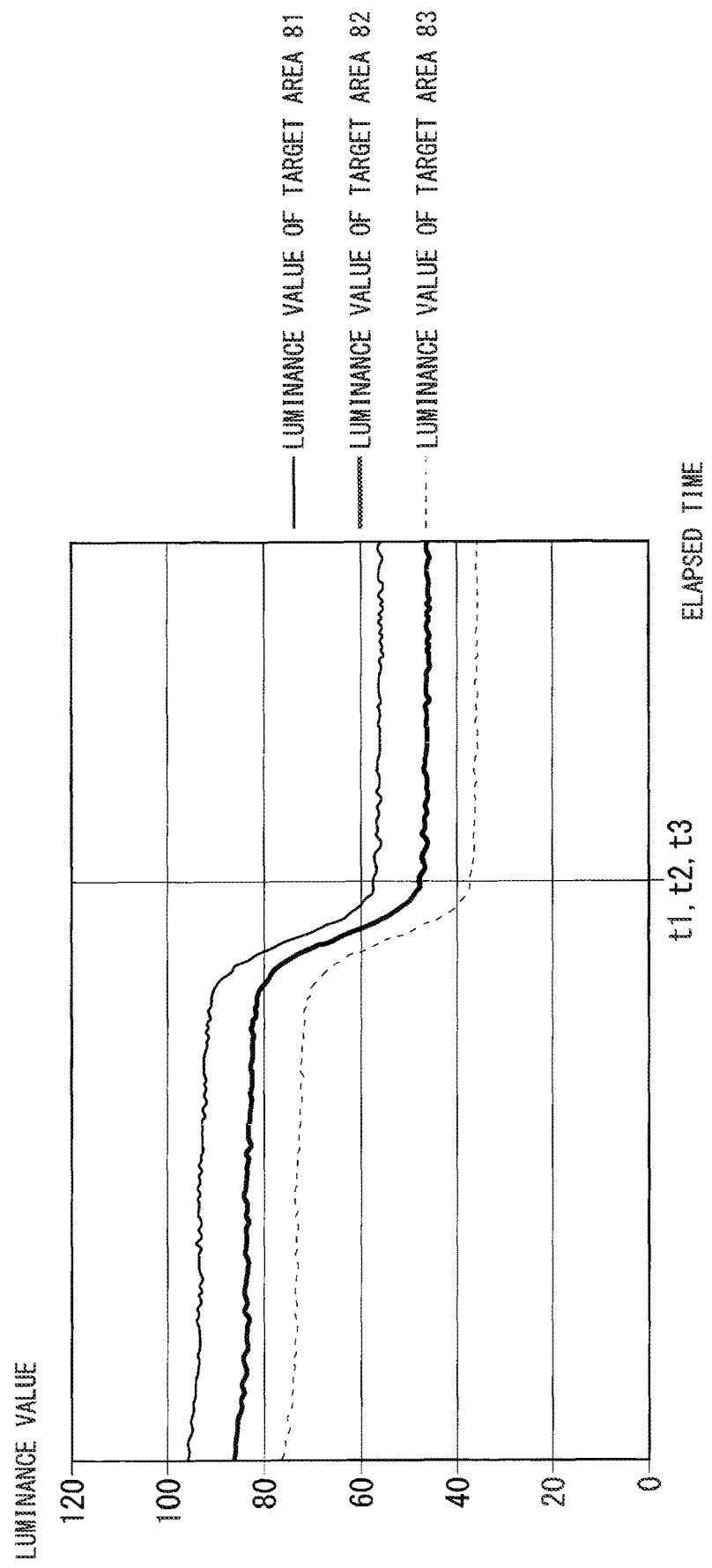

F I G. 1 5
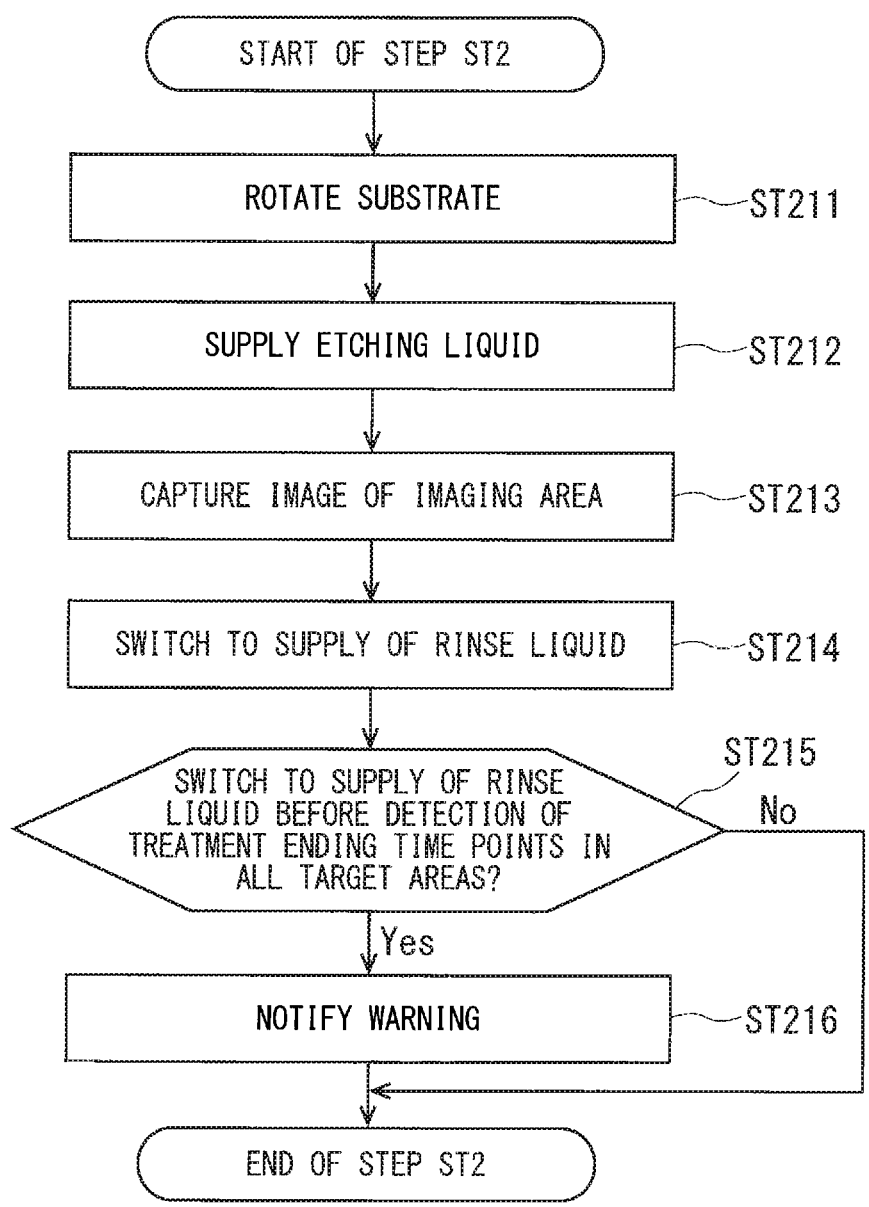

SUBSTRATE TREATMENT DEVICE AND SUBSTRATE TREATMENT METHOD

BACKGROUND OF THE INVENTION

Field of the Invention

A subject matter disclosed in the present specification relates to a substrate treatment device and a substrate treatment method, which perform predetermined treatment of discharging a treatment liquid from a nozzle onto a sheet-like precision electronic substrate (hereinafter simply referred to as "substrate"), such as a semiconductor wafer or a glass substrate for a liquid-crystal display.

Description of the Background Art

In a manufacturing process of a semiconductor device and the like, substrate treatment, such as cleaning treatment and resist coating treatment, has hitherto been performed by supplying a substrate with various treatment liquids such as pure water, a photoresist liquid, and an etching liquid. As a device to perform substrate treatment by using these treatment liquid, a substrate treatment device is widely used which discharges the treatment liquid from a nozzle onto the surface of the substrate while rotating the substrate in a horizontal posture.

For example, Japanese Patent No. 4947887 discloses a device that compares a model image, previously recorded as an image showing a state in which an etching liquid is supplied on the substrate (more specifically, an image obtained when the etching treatment is performed normally), with an image acquired at the time of etching treatment, to determine whether or not the etching treatment has proceeded normally.

Japanese Patent No. 5305792 discloses a device that acquires changes in color and brightness based on a captured image obtained by capturing an image of a surface to be treated of a substrate and detects a treatment ending time point of the substrate treatment by determining that the substrate treatment has ended when the change in the substrate state becomes equal to or less than an allowable value.

However, even when the technique shown in Japanese Patent No. 4947887 or Japanese Patent No. 5305792 is used, it is only possible to grasp a treatment ending time point in one place on the surface to be treated of the substrate, and it is not possible to grasp a treatment ending time point in another place.

There is typically a difference in the treatment ending time point between the center side and the outer circumferential side of the surface to be treated, and for example, even when the treatment ends on the center side of the surface to be treated, the treatment on the outer circumferential side may be in progress. In this case, if the treatment ending time point is detected based on an imaging result on the center side and the substrate treatment is stopped, the treatment on the outer circumferential side might be incomplete.

SUMMARY

An object of the present invention is to provide a substrate treatment device and a substrate treatment method capable of grasping a treatment ending time point in each of the center side and the outer circumferential side of the surface to be treated of the substrate.

The present invention is directed to a substrate treatment device.

According to the present invention, a substrate treatment device includes: a substrate rotation part that horizontally holds and rotates a substrate; a nozzle that supplies a treatment liquid to a surface to be treated of the substrate rotated by the substrate rotation part; an imaging part that captures an image of an imaging area including a plurality of target areas in which a liquid film is formed when the treatment liquid is supplied to the substrate; and a detection part that refers to an imaging result of the imaging part and detects a treatment ending time point of each of the plurality of target areas based on a change in luminance value for each of the plurality of target areas. The imaging area includes at least an area on a center side of the surface to be treated and an area on an outer circumferential side of the surface to be treated as the plurality of target areas.

Preferably, the detection part compares differences in magnitude between a differential value, which is an amount of change in the luminance value in a unit period, and a threshold and detects the treatment ending time point based on a result of the comparison.

Preferably, when a fluctuation width of the differential value falls within a specific range in a state where the differential value becomes larger than the threshold and then becomes smaller than the threshold or in a state where the differential value becomes smaller than the threshold and then becomes larger than the threshold, the detection part detects a time point at which the fluctuation width falls within the range as the treatment ending time point.

Preferably, the detection part detects the treatment ending time point of each of the plurality of target areas based on a change in average luminance value for each of the plurality of target areas, the average luminance value being averaged with a time width larger than time required for one rotation of the substrate.

Preferably, the imaging part acquires a plurality of captured images with the time width, and the average luminance value is an average value of the luminance value for each of the target areas in the captured images.

Preferably, the imaging part acquires one captured image with the time width taken as an exposure time, and the average luminance value is an average value of the luminance value for each of the target areas in the one captured image.

Preferably, the supply of the treatment liquid by the nozzle is stopped when the detection part detects the treatment ending time point of each of the target areas.

Preferably, the substrate treatment device further includes a notification part that notifies a warning when the detection part has not detected the treatment ending time point of each of the target areas upon stopping of the supply of the treatment liquid by the nozzle.

Preferably, the substrate treatment device further includes an adjustment part that adjusts a condition of substrate treatment based on a detection result of the detection part when a plurality of the substrates are treated with the treatment liquid.

Preferably, the substrate treatment device further includes a prediction part that predicts a secular change in each part of the device based on a detection result of the detection part when a plurality of the substrates are treated with the treatment liquid.

Preferably, the treatment liquid is an etching liquid.

The present invention is directed to a substrate treatment method.

According to the present invention, a substrate treatment method includes: a substrate rotation step of horizontally holding and rotating a substrate; a supply step of supplying a treatment liquid to a surface to be treated of the substrate rotated by the substrate rotation step; an imaging step of capturing an image of an imaging area including a plurality of target areas in which a liquid film of the surface to be treated is formed when the treatment liquid is supplied to the substrate; and a detection step of referring to an imaging result in the imaging step and detecting a treatment ending time point of each of the plurality of target areas based on a change in luminance value for each of the plurality of target areas, wherein the imaging area includes at least an area on a center side of the surface to be treated and an area on an outer circumferential side of the surface to be treated as the plurality of target areas.

According to one aspect of the present invention, in the detection step, differences in magnitude between a differential value, which is an amount of change in the luminance value in a unit period, and a threshold are compared, to detect the treatment ending time point based on a result of the comparison.

According to one aspect of the present invention, when a fluctuation width of the differential value falls within a specific range in a state where the differential value becomes larger than the threshold and then becomes smaller than the threshold or in a state where the differential value becomes smaller than the threshold and then becomes larger than the threshold, a time point at which the fluctuation width falls within the range is detected as the treatment ending time point in the detection step.

According to one aspect of the present invention, in the detection step, the treatment ending time point of each of the plurality of target areas is detected based on a change in average luminance value for each of the plurality of target areas, the average luminance value being averaged with a time width larger than time required for one rotation of the substrate.

According to one aspect of the present invention, in the imaging step, a plurality of captured images are acquired with the time width, and the average luminance value is an average value of the luminance value for each of the plurality of target areas in the plurality of captured images.

According to one aspect of the present invention, in the imaging step, one captured image is acquired with the time width taken as an exposure time, and the average luminance value is an average value of the luminance value for each of the plurality of target areas in the one captured image.

According to one aspect of the present invention, the supply step is stopped when the treatment ending time point of each of the plurality of target areas is detected in the detection step.

According to one aspect of the present invention, the substrate treatment method further includes a notification step of notifying a warning when the treatment ending time point of each of the plurality of target areas has not been detected by the detection step upon stopping of the supply step.

According to one aspect of the present invention, the substrate treatment method further includes an adjustment step of adjusting a condition of substrate treatment based on a plurality of detection results by the detection step when a plurality of the substrates are treated with the treatment liquid.

According to one aspect of the present invention, the substrate treatment method further includes a prediction step of predicting a secular change in each part of the device based on a plurality of detection results by the detection step when a plurality of the substrates are treated with the treatment liquid.

According to one aspect of the present invention, the treatment liquid is an etching liquid.

According to the present invention, the treatment ending time point of each of the plurality of target areas is detected based on the change in luminance value for each of the plurality of target areas, obtained from the imaging result. The imaging area includes at least an area on the center side of the surface to be treated and the area on the outer circumferential side thereof. Therefore, it is possible to grasp the treatment ending time point on each of the center side and the outer circumferential side of the surface to be treated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a graph showing transition of a luminance value in a plurality of consecutive frames for each target area;

FIG. 14 is a graph showing transition of a luminance value in a plurality of consecutive frames for each target area; and FIG. 15 is a flowchart showing an example of substrate treatment according to a modification;

DESCRIPTION OF THE PREFERRED EMBODIMENTS

Hereinafter, preferred embodiments of the present invention will be described in detail with reference to the drawings.

Preferred Embodiment

Figure 1:
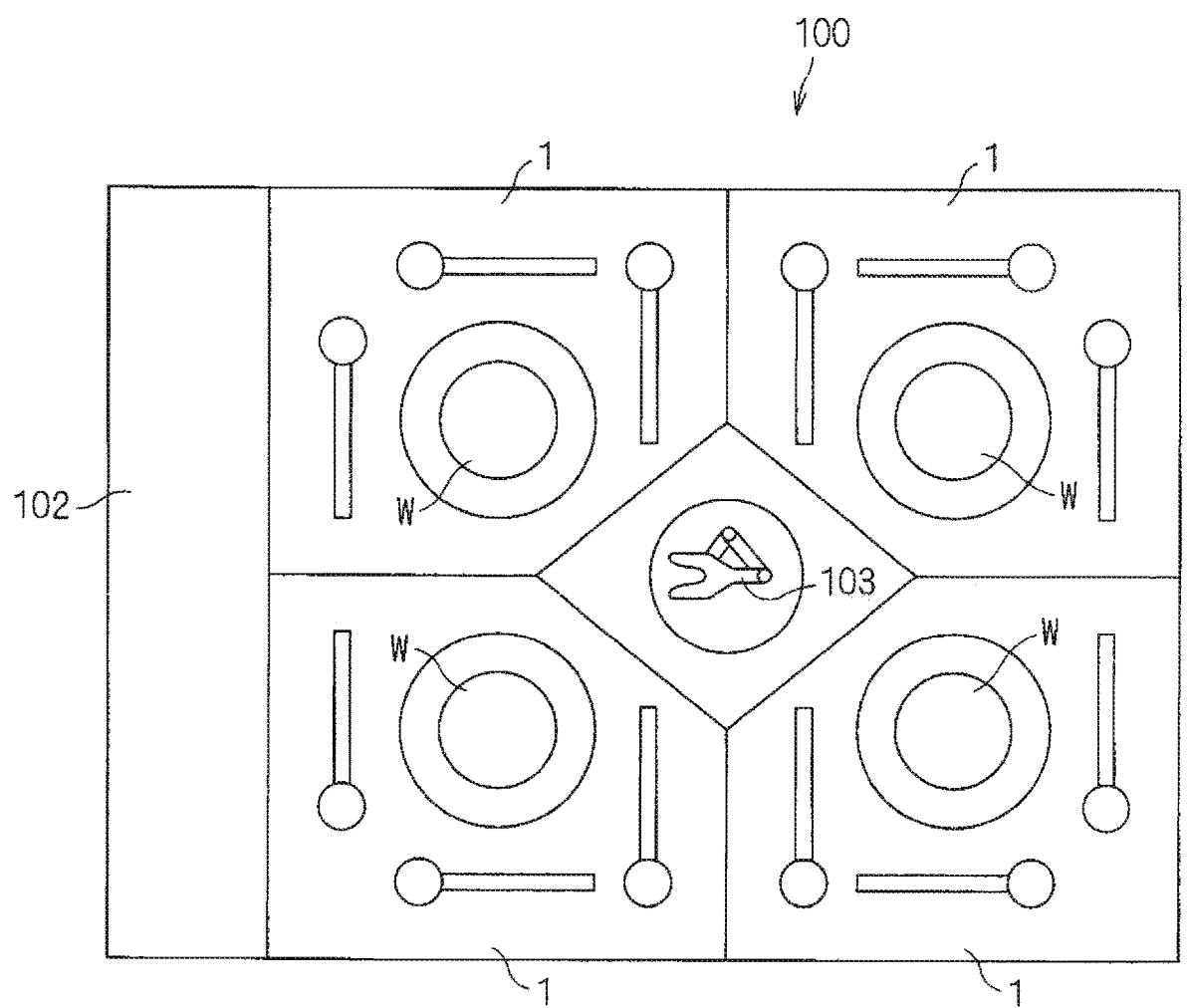
FIG. 1 is a view showing an overall configuration of a substrate treatment device according to the present invention.

FIG. 1 is a view showing an overall configuration of a substrate treatment device 100 according to the present invention. This substrate treatment device 100 is a sheet-type treatment device for treating substrates W for semiconductor use one by one, and liquid treatment using a chemical liquid and pure water is performed on the circular silicon substrate W, followed by drying treatment. As the chemical liquid, typically, an SC1 liquid (mixed solution of ammonia water, hydrogen peroxide water, and water), an SC2 liquid (mixed solution of hydrochloric acid, hydrogen peroxide water, and water), a DHF liquid (dilute hydrofluoric acid), and the like are used. In the present specification, the chemical liquid and pure water are collectively referred to as a "treatment liquid." Note that the "treatment liquid" of the present invention includes not only the liquid for cleaning treatment, but also a coating liquid such as a photoresist liquid for film formation treatment, a chemical liquid for removal of an unnecessary film, and a chemical liquid for etching (e.g., hydrofluoric acid).

The substrate treatment device 100 includes an indexer 102, a plurality of treatment units 1, and a main transport robot 103. The indexer 102 has a function of carrying the untreated substrate W, received from the outside of the device, into the device. The indexer 102 has a function of carrying the treated substrate W which has been treated out of the substrate treatment device 100. The indexer 102 is mounted with a plurality of carriers and also includes a transfer robot (neither of which are shown). As the carrier, it is possible to adopt a known front opening unified pod (FOUP), a known standard mechanical interface (SMIF) pod for accommodating the substrate W in a sealed space, or a known open cassette (OC) with the accommodated substrate W in contact with the outside air. The transfer robot transfers the substrate W between the carrier and the main transport robot 103.

In the substrate treatment device 100, twelve treatment units 1 are arranged. A detailed arrangement configuration is that, four towers, in each of which three treatment units 1 are stacked, are arranged so as to surround the main transport robot 103. In other words, four treatment units 1 arranged surrounding the main transport robot 103 are each stacked in three stages, among which one layer is shown in FIG. 1. The number of treatment units 1 mounted on the substrate treatment device 100 is not limited to 12, and may be 8 or 4, for example.

The main transport robot 103 is installed at the center of the four towers in which the treatment units 1 are stacked. The main transport robot 103 carries the untreated substrate W received from the indexer 102 to each treatment unit 1, and carries out the treated substrate W from each treatment unit 1 to pass the substrate W to the indexer 102.

Figure 2:
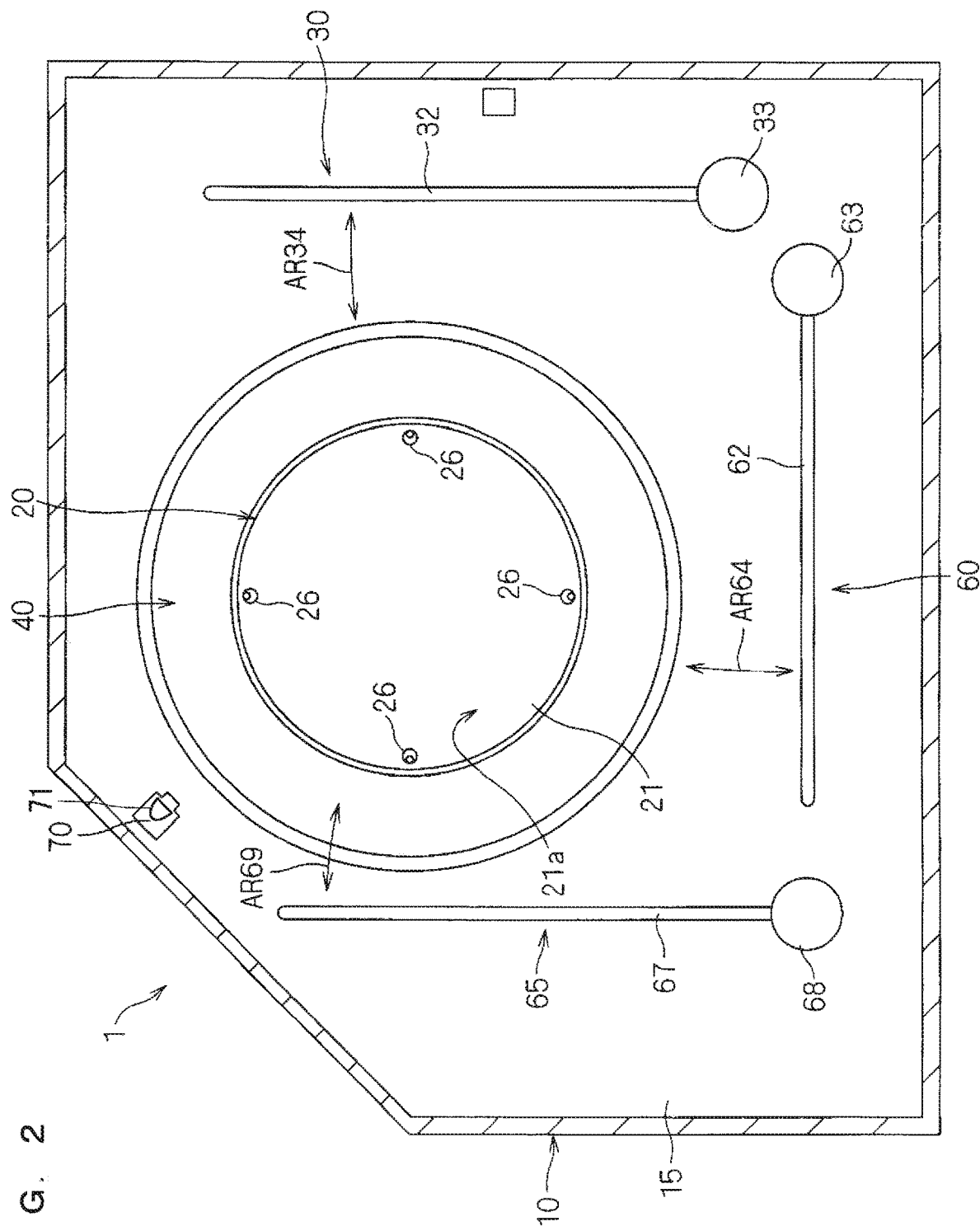
FIG. 2 is a plan view of a treatment unit.
Figure 3:
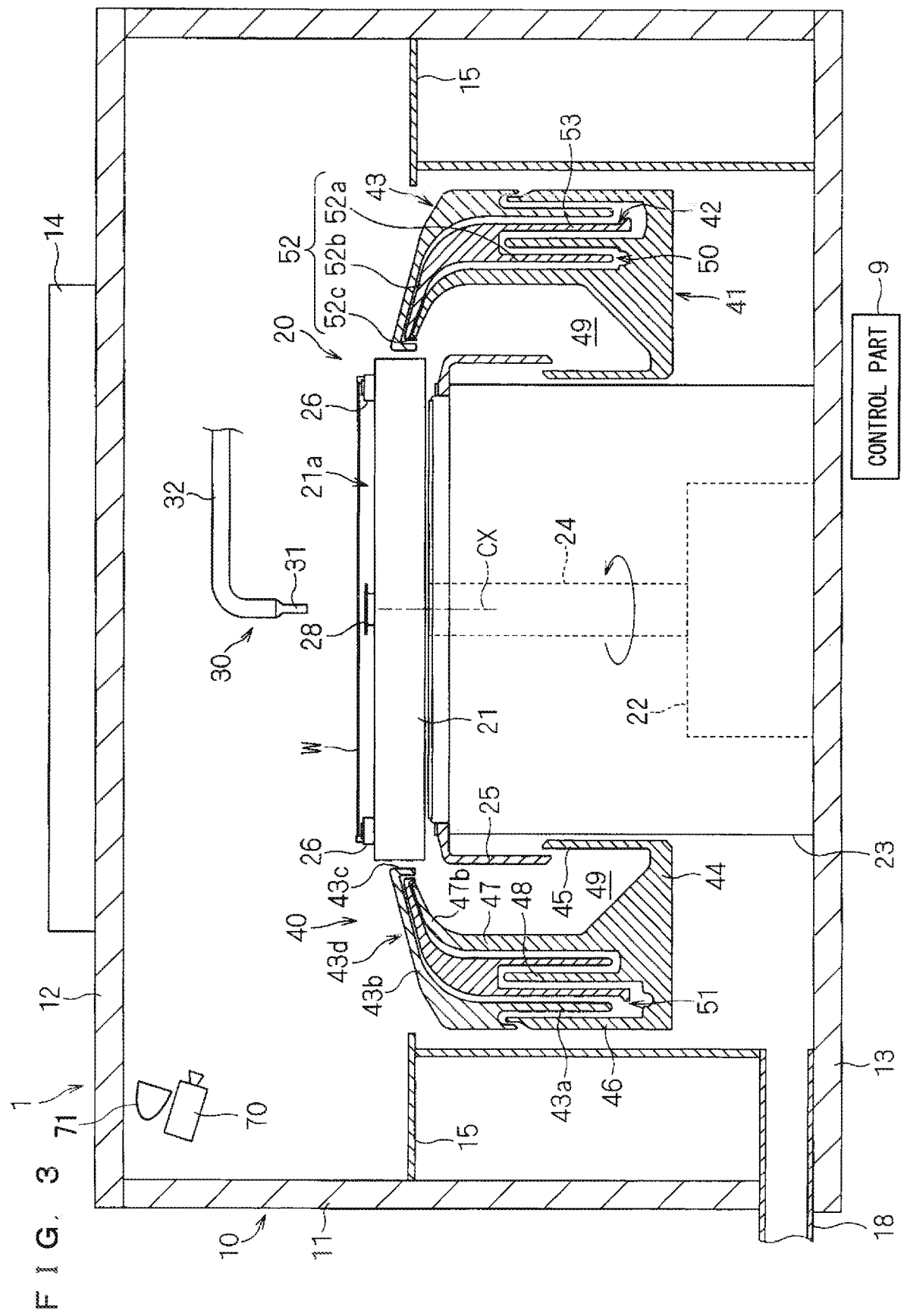
FIG. 3 is a longitudinal sectional view of the treatment unit.

Next, the treatment unit 1 will be described. Hereinafter, one of the twelve treatment units 1 mounted on the substrate treatment device 100 will be described, but the other treatment units 1 are completely the same. FIG. 2 is a plan view of the treatment unit 1. FIG. 3 is a longitudinal sectional view of the treatment unit 1. Note that FIG. 2 shows a state in which the substrate W is not held by a spin chuck 20, and FIG. 3 shows a state in which the substrate W is held by the spin chuck 20.

In the chamber 10, the treatment unit 1 includes, as main components, the spin chuck 20 for holding the substrate W in a horizontal posture (a posture in which a normal line extends along a vertical direction), three upper surface treatment liquid nozzles 30, 60, 65 each for supplying a treatment liquid to the upper surface of the substrate W held by the spin chuck 20, a treatment cup 40 surrounding the spin chuck 20, and an imaging part 70 for capturing an image of a space above the spin chuck 20. A partition plate 15 for vertically partitioning the inner space of the chamber 10 is provided around the treatment cup 40 in the chamber 10.

The chamber 10 includes a side wall 11 along the vertical direction, a ceiling wall 12 closing the upper side of a space surrounded by the side wall 11, and a floor wall 13 closing the lower side of the space. A space surrounded by the side wall 11, the ceiling wall 12, and the floor wall 13 serves as a treatment space for the substrate W. A part of the side wall 11 of the chamber 10 is provided with a loading/unloading port for the main transport robot 103 to carry the substrate W into and out of the chamber 10 and a shutter for opening and closing the loading/unloading port (neither of which are shown).

The ceiling wall 12 of the chamber 10 is mounted with a fan filter unit (FFU) 14 for further cleaning air in a clean room where the substrate treatment device 100 is installed and supplying the air to the treatment space in the chamber 10. The fan filter unit 14 includes a fan and a filter (e.g., HEPA filter) for taking the air in the clean room and delivering the air into the chamber 10, and forms a down flow of clean air in the treatment space in the chamber 10. In order to uniformly disperse the clean air supplied from the fan filter unit 14, a punching plate provided with a number of blowout holes may be provided immediately below the ceiling wall 12.

The spin chuck 20 includes a disk-shaped spin base 21 fixed in a horizontal posture to the upper end of a rotating shaft 24 extending along the vertical direction. A spin motor 22 for rotating the rotating shaft 24 is provided below the spin base 21. The spin motor 22 rotates the spin base 21 in a horizontal plane via the rotating shaft 24. A cylindrical cover member 23 is provided so as to surround the spin motor 22 and the rotating shaft 24.

The outer diameter of the disk-shaped spin base 21 is slightly larger than the diameter of the circular substrate W held by the spin chuck 20. Therefore, the spin base 21 has a holding surface 21a facing the entire lower surface of the substrate W to be held.

A plurality of (four in the present preferred embodiment) chuck pins 26 are erected on the circumferential portion of the holding surface 21a of the spin base 21. The plurality of chuck pins 26 are arranged at equal intervals along the circumference corresponding to the outer circumference circle of the circular substrate W (at an interval of 90° in the case of the four chuck pins 26 as in the present preferred embodiment). The plurality of chuck pins 26 are interlocked and driven by a link mechanism (not shown) accommodated in the spin base 21. The spin chuck 20 grips the substrate W by bringing each of the chuck pins 26 into contact with the outer circumferential end of the substrate W so as to be able to hold the substrate W in a horizontal posture close to the holding surface 21a above the spin base 21 (cf. FIG. 3), and also to separate each of the chuck pins 26 from the outer circumferential end of the substrate W and release the gripping.

The lower end of the cover member 23 covering the spin motor 22 is fixed to the floor wall 13 of the chamber 10, and the upper end thereof reaches a position immediately below the spin base 21. At the upper end portion of the cover member 23, a flange-like member 25 is provided which projects outward from the cover member 23 almost horizontally and further bends downward. The spin motor 22 rotates the rotating shaft 24 in a state where the spin chuck 20 holds the substrate W by grasping with the chuck pins 26 so that the spin chuck 20 can rotate the substrate W around the shaft center CX along the vertical direction passing through the center of the substrate W. In this manner, the spin chuck 20, the spin motor 22, and the rotating shaft 24 function as a substrate rotation part that horizontally holds and rotates the substrate W. Note that driving of the spin motor 22 is controlled by a control part 9.

The upper surface treatment liquid nozzle 30 is configured by attaching a discharge head 31 to the tip of a nozzle arm 32. The base end side of the nozzle arm 32 is fixedly connected to a nozzle base 33. The nozzle base 33 can rotationally move around a shaft along the vertical direction by a motor (not shown). By turning of the nozzle base 33, as shown by an arrow AR34 in FIG. 2, the upper surface treatment liquid nozzle 30 moves in an arc along the horizontal direction between a treatment position above the substrate W held by the spin chuck 20 and a standby position outside the treatment cup 40. A plurality of kinds of treatment liquids (including at least pure water) are supplied to the upper surface treatment liquid nozzle 30. The treatment liquid discharged from the discharge head 31 of the upper surface treatment liquid nozzle 30 at the treatment position is applied to the upper surface of the substrate W held by the spin chuck 20. By turning of the nozzle base 33, the upper surface treatment liquid nozzle 30 is swingable above the holding surface 21a of the spin base 21. It is not essential that the discharge head 31 be provided at the tip portion of the pipe as in the present preferred embodiment, and the treatment liquid may be discharged directly from the tip of the pipe.

Further, in the treatment unit 1 of the present preferred embodiment, in addition to the above-described upper surface treatment liquid nozzle 30, two upper surface treatment liquid nozzles 60, 65 are further provided. The upper surface treatment liquid nozzles 60, 65 of the present preferred embodiment have the same configuration as the upper surface treatment liquid nozzle 30. That is, the upper surface treatment liquid nozzle 60 is configured by attaching a discharge head to the tip of the nozzle arm 62, and moves in an arc between the treatment position above the spin chuck 20 and the standby position outside the treatment cup 40 by a nozzle base 63 connected to the base end side of the nozzle arm 62, as indicated by an arrow AR64. Similarly, the upper surface treatment liquid nozzle 65 is configured by attaching a discharge head to the tip of the nozzle arm 67, and moves in an arc between the treatment position above the spin chuck 20 and the standby position outside the treatment cup 40 by a nozzle base 68 connected to the base end side of the nozzle arm 67, as indicated by an arrow AR69. A plurality of kinds of treatment liquids including at least pure water are supplied to the upper surface treatment liquid nozzles 60, 65, and the treatment liquid is discharged to the upper surface of the substrate W held by the spin chuck 20 at the treatment position. At least one of the upper surface treatment liquid nozzles 60, 65 may be a two-fluid nozzle that mixes the cleaning liquid such as pure water with pressurized gas to generate liquid droplets and injects a mixed fluid of the liquid droplets and a gas onto the substrate W. The number of nozzles provided in the treatment unit 1 is not limited to three but may only be one or more.

On the other hand, a lower surface treatment liquid nozzle 28 is provided along the vertical direction so as to pass through the inside of the rotating shaft 24. The upper end opening of the lower surface treatment liquid nozzle 28 is formed at a position facing the center of the lower surface of the substrate W held by the spin chuck 20. A plurality of kinds of treatment liquids are also supplied to the lower surface treatment liquid nozzle 28. The treatment liquid discharged from the lower surface treatment liquid nozzle 28 is applied to the lower surface of the substrate W held by the spin chuck 20. In the present preferred embodiment, only an aspect will be described in which each of the upper surface and the lower surface of the substrate W is the surface to be treated and the treatment liquid can be supplied to both surfaces, but an aspect may be adopted in which only one surface (e.g., only the upper surface of the substrate W) is the surface to be treated and the treatment liquid can be supplied only to the one surface.

The treatment cup 40 surrounding the spin chuck 20 includes an inner cup 41, a middle cup 42, and an outer cup 43 that can be lifted and lowered independently of each other. The inner cup 41 surrounds the spin chuck 20 and has a shape that is almost rotationally symmetric to the shaft center CX passing through the center of the substrate W held by the spin chuck 20. The inner cup 41 integrally includes: an annular bottom portion 44 in plan view; a cylindrical inner wall portion 45 rising upward from the inner circumferential edge of the bottom portion 44; a cylindrical outer wall portion 46 rising upward from the outer circumferential edge of the bottom portion 44; a first guide portion 47 rising from between the inner wall portion 45 and the outer wall portion 46 and having an upper end portion extending obliquely upward on the center side (a direction approaching a shaft center CX of the substrate W held by the spin chuck 20) while drawing a smooth circular arc; and a cylindrical middle wall portion 48 rising upwardly from between the first guide portion 47 and the outer wall portion 46.

The inner wall portion 45 is formed to have such a length as to be accommodated between the cover member 23 and the flange-like member 25 with an appropriate gap held therebetween, in a state where the inner cup 41 is lifted the most. The middle wall portion 48 is formed to have such a length as to be accommodated between a later-described second guide portion 52 and a later-described treatment liquid separation wall 53 of the middle cup 42 with an appropriate gap held therebetween, in a state where the inner cup 41 and the middle cup 42 are closest to each other.

The first guide portion 47 has an upper end portion 47b extending obliquely upward on the center side (the direction approaching the shaft center CX of the substrate W) while drawing a smooth circular arc. A space between the inner wall portion 45 and the first guide portion 47 is formed as a drainage groove 49 for collecting and discharging the used treatment liquid. A space between the first guide portion 47 and the middle wall portion 48 is formed as an annular inner collection groove 50 for collecting the used treatment liquid. A space between the middle wall portion 48 and the outer wall portion 46 is formed as an annular outer collection groove 51 for collecting a treatment liquid of a different kind from the treatment liquid collected by the inner collection groove 50.

The drainage groove 49 is connected with a drainage/exhaust mechanism (not shown) for forcibly discharging the air inside the drainage groove 49 while discharging the treatment liquid collected in the drainage groove 49. For example, four drainage/exhaust mechanisms are provided at regular intervals along the circumferential direction of the drainage groove 49. Further, the inner collection groove 50 and the outer collection groove 51 are connected with a collection mechanism for collecting the treatment liquid, collected in each of the inner collection groove 50 and the outer collection groove 51, to a collection tank provided outside the substrate treatment device 100 (neither of which are shown). The bottoms of the inner collection groove 50 and the outer collection groove 51 are inclined by a slight angle with respect to the horizontal direction, and the collection mechanism is connected to the lowest position. Thereby, the treatment liquid having flowed into each of the inner collection groove 50 and the outer collection groove 51 is collected smoothly.

The middle cup 42 surrounds the spin chuck 20 and has a shape that is almost rotationally symmetric to the shaft center CX passing through the center of the substrate W held by the spin chuck 20. The middle cup 42 integrally includes the second guide portion 52 and the cylindrical treatment liquid separation wall 53 connected to the second guide portion 52.

Outside the first guide portion 47 of the inner cup 41, the second guide portion 52 includes a lower end portion 52*a* coaxially cylindrical with the lower end portion of the first guide portion 47, an upper end portion 52*b* extending obliquely upward on the center side (the direction approaching the shaft center CX of the substrate W) while drawing a smooth circular arc from the upper end of the lower end portion 52*a*, and a folded portion 52*c* formed by folding the tip portion of the upper end portion 52*b* downward. The lower end portion 52*a* is accommodated in the inner collection groove 50 while holding an appropriate gap between the first guide portion 47 and the middle wall portion 48 in a state where the inner cup 41 and the middle cup 42 are closest to each other. The upper end portion 52*b* is provided so as to overlap with the upper end portion 47*b* of the first guide portion 47 of the inner cup 41 in the vertical direction, and in a state where the inner cup 41 and the middle cup 42 are closest to each other, the upper end portion 52*b* approaches the upper end portion 47*b* of the first guide portion 47 with a very small space held therebetween. The folded portion 52*c* formed by folding the tip portion of the upper end portion 52*b* downward has such a length as to overlap with the tip of the upper end portion 47*b* of the first guide portion 47 in the horizontal direction in a state where the inner cup 41 and the middle cup 42 are closest to each other.

The upper end portion 52*b* of the second guide portion 52 is formed with a thickness increasing downward, and the treatment liquid separation wall 53 has a cylindrical shape, provided so as to extend downward from the lower end outer circumferential portion of the upper end portion 52*b*. The treatment liquid separation wall 53 is accommodated in the outer collection groove 51 while holding an appropriate gap between the middle wall portion 48 and the outer cup 43 in a state where the inner cup 41 and the middle cup 42 are closest to each other.

The outer cup 43 surrounds the spin chuck 20 on the outside of the second guide portion 52 of the middle cup 42 and has a shape that is almost rotationally symmetric to the shaft center CX passing through the center of the substrate W held by the spin chuck 20. The outer cup 43 has a function as a third guide portion. The outer cup 43 includes a lower end portion 43*a* coaxially cylindrical with the lower end portion 52*a* of the second guide portion 52, an upper end portion 43*b* extending obliquely upward on the center side (the direction approaching the shaft center CX of the substrate W) while drawing a smooth circular arc from the upper end of the lower end portion 43*a*, and a folded portion 43*c* formed by folding the tip portion of the upper end portion 43*b* downward.

The lower end portion 43*a* is accommodated in the outer collection groove 51 while holding an appropriate gap between the treatment liquid separation wall 53 of the middle cup 42 and the outer wall portion 46 of the inner cup 41 in a state where the inner cup 41 and the outer cup 43 are closest to each other. The upper end portion 43*b* is provided so as to overlap with the second guide portion 52 of the middle cup 42 in the vertical direction, and in a state where the middle cup 42 and the outer cup 43 are closest to each other, the upper end portion 43*b* approaches the upper end portion 52*b* of the second guide portion 52 with a very small space held therebetween. The folded portion 43*c* formed by folding the tip portion of the upper end portion 43*b* downward is formed so as to overlap with the folded portion 52*c* of the second guide portion 52 in the horizontal direction in a state where the middle cup 42 and the outer cup 43 are closest to each other.

Further, the inner cup 41, the middle cup 42, and the outer cup 43 can be lifted and lowered independently of each other. That is, each of the inner cup 41, the middle cup 42, and the outer cup 43 is individually provided with a lifting mechanism (not shown), whereby each cup is lifted and lowered separately and independently. As such a lifting mechanism, various well-known mechanisms such as a ball screw mechanism and an air cylinder can be adopted.

The partition plate 15 is provided so as to vertically partition the inner space of the chamber 10 around the treatment cup 40. The partition plate 15 may be a single plate member surrounding the treatment cup 40 or may be a combination of a plurality of plate members. Further, the partition plate 15 may be provided with a through hole penetrating in the thickness direction or a cutout, and in the present preferred embodiment, a through hole is formed to pass a support shaft for supporting the nozzle bases 33, 63, 68 of the upper surface treatment liquid nozzles 30, 60, 65.

The outer circumferential end of the partition plate 15 is connected to the side wall 11 of the chamber 10. An edge portion of the partition plate 15 surrounding the treatment cup 40 is formed so as to have a circular shape with a larger diameter than the outer diameter of the outer cup 43. Therefore, the partition plate 15 does not become an obstacle for lifting and lowering the outer cup 43.

An exhaust duct 18 is provided in the vicinity of the floor wall 13 as a part of the side wall 11 of the chamber 10. The exhaust duct 18 is communicatively connected to an exhaust mechanism (not shown). Among the clean air supplied from the fan filter unit 14 and flowing down in the chamber 10, the air having passed between the treatment cup 40 and the partition plate 15 is discharged from the exhaust duct 18 to the outside of the device.

Figure 4:
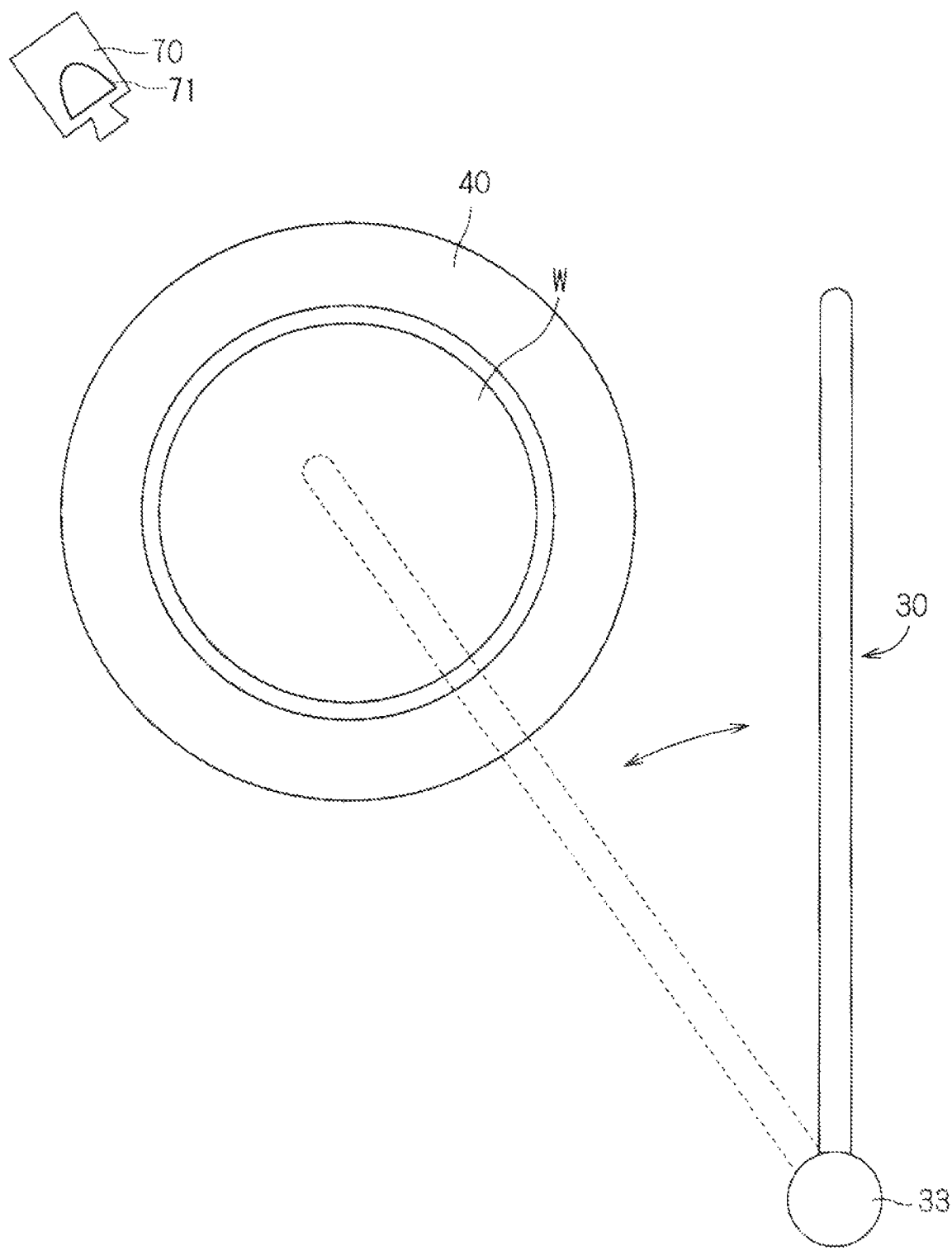
FIG. 4 is a diagram showing a positional relationship between an imaging part and an upper surface treatment liquid nozzle.

The imaging part 70 is installed in the chamber 10 and above the partition plate 15. FIG. 4 is a diagram showing a positional relationship between the imaging part 70 and the upper surface treatment liquid nozzle 30. In FIG. 4, the upper surface treatment liquid nozzle 30 positioned at the treatment position is drawn by a dotted line, and the upper surface treatment liquid nozzle 30 positioned at the standby position is drawn by a solid line.

Figure 5:
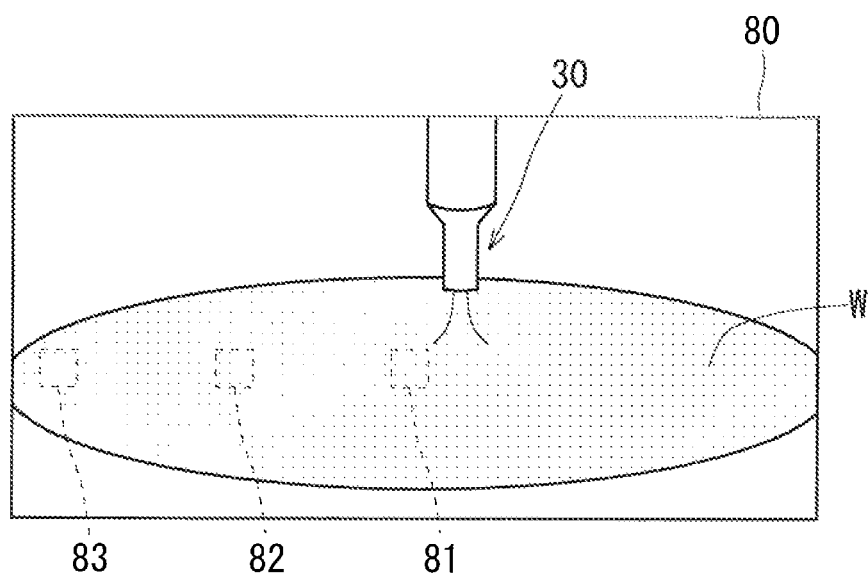
FIG. 5 is a schematic image showing an imaging area at an initial stage of etching treatment.
Figure 6:
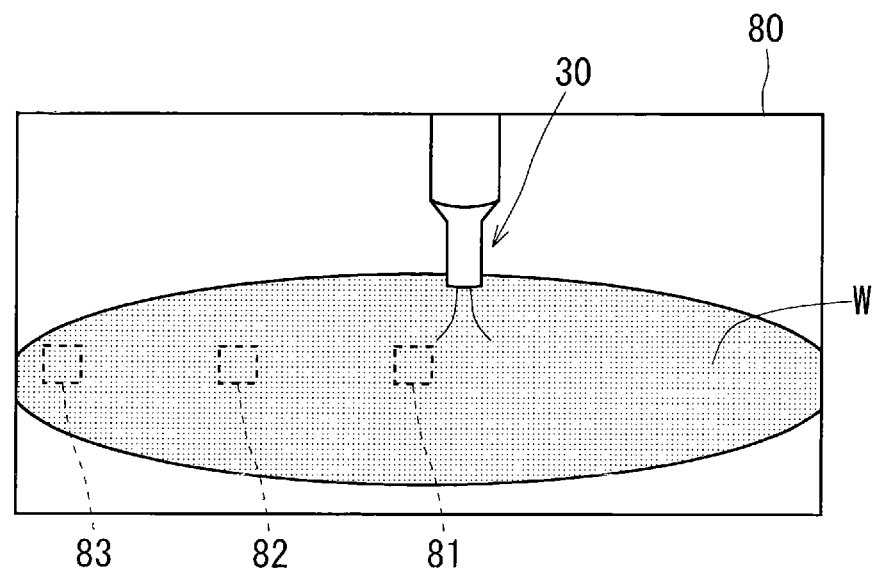
FIG. 6 is a schematic image showing the imaging area at a later stage of the etching treatment.
Figure 7:
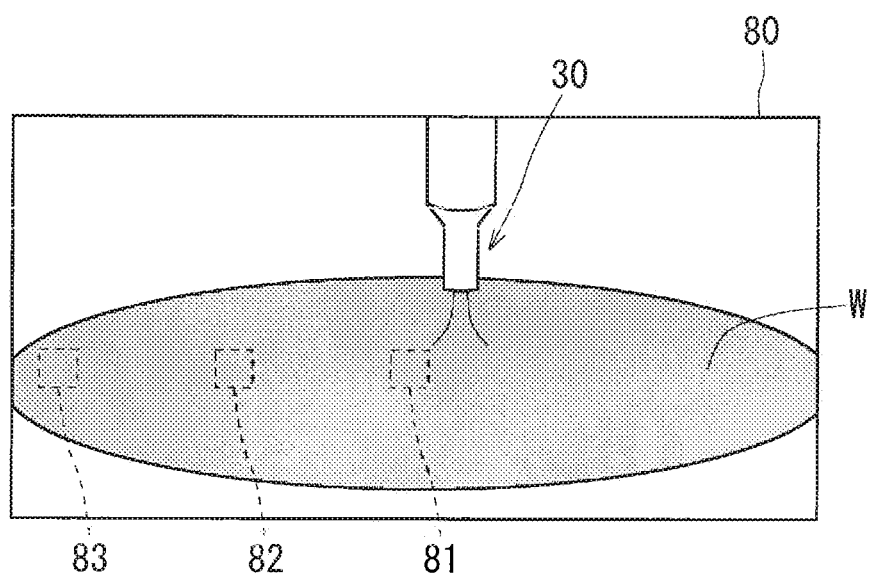
FIG. 7 is a schematic image showing the imaging area at the end of the etching treatment.

The imaging part 70 is, for example, a charge coupled device (CCD) camera or a complementary metal oxide semiconductor (CMOS) camera and is configured to be capable of adjusting the exposure time and the number of frames as parameters for imaging. The imaging part 70 is installed at a position to photograph the upper surface treatment liquid nozzle 30 and the upper surface of the substrate W at the treatment position from the oblique upper side. Therefore, as shown in FIGS. 5 to 7, the imaging part 70 can capture an image of an imaging area 80 including target areas 81 to 83 in which a liquid film is formed when the treatment liquid is discharged from the upper surface treatment liquid nozzle 30 to the substrate W at the treatment position. Here, the target area means an area which is particularly a target of luminance detection in the imaging area 80. FIG. 5 is a schematic image showing the imaging area 80 at the initial stage of etching treatment described later. FIG. 6 is a schematic image showing the imaging area 80 at the latter stage of the etching treatment. FIG. 7 is a schematic image showing the imaging area 80 at the end of the etching treatment. Here, the target area 81 is an area on the center side of the upper surface of the substrate W, the target area 83 is an area on the outer circumferential side of the upper surface of the substrate W, and the target area 82 is an area between the target areas 81 and 83. In FIGS. 5 to 7, the shading of the upper surface of the substrate W is changed from a sparse state to a dense state to express how the luminance of the upper surface decreases in the course of the treatment.

Similarly, the imaging part 70 can capture an image of the imaging area 80 including the target areas 81 to 83 in which the liquid film is formed when the treatment liquid is discharged from each of the upper surface treatment liquid nozzles 60, 65 to the substrate W at the treatment position. When the imaging part 70 is installed at the position shown in FIGS. 2 and 4, the upper surface treatment liquid nozzles 30, 60 move laterally within the imaging field of view of the imaging part 70, and hence it is easy to properly capture an image of the movement in the vicinity of the treatment position.

As shown in FIGS. 2 to 4, an illumination part 71 is provided above the imaging part 70 in the chamber 10. Since the interior of the chamber 10 is normally a dark room, when the imaging part 70 performs imaging, the illumination part 71 irradiates the imaging area 80 of the imaging part 70 with light. As the illumination part 71, for example, a light emitting diode (LED) illumination can be used.

Figure 8:
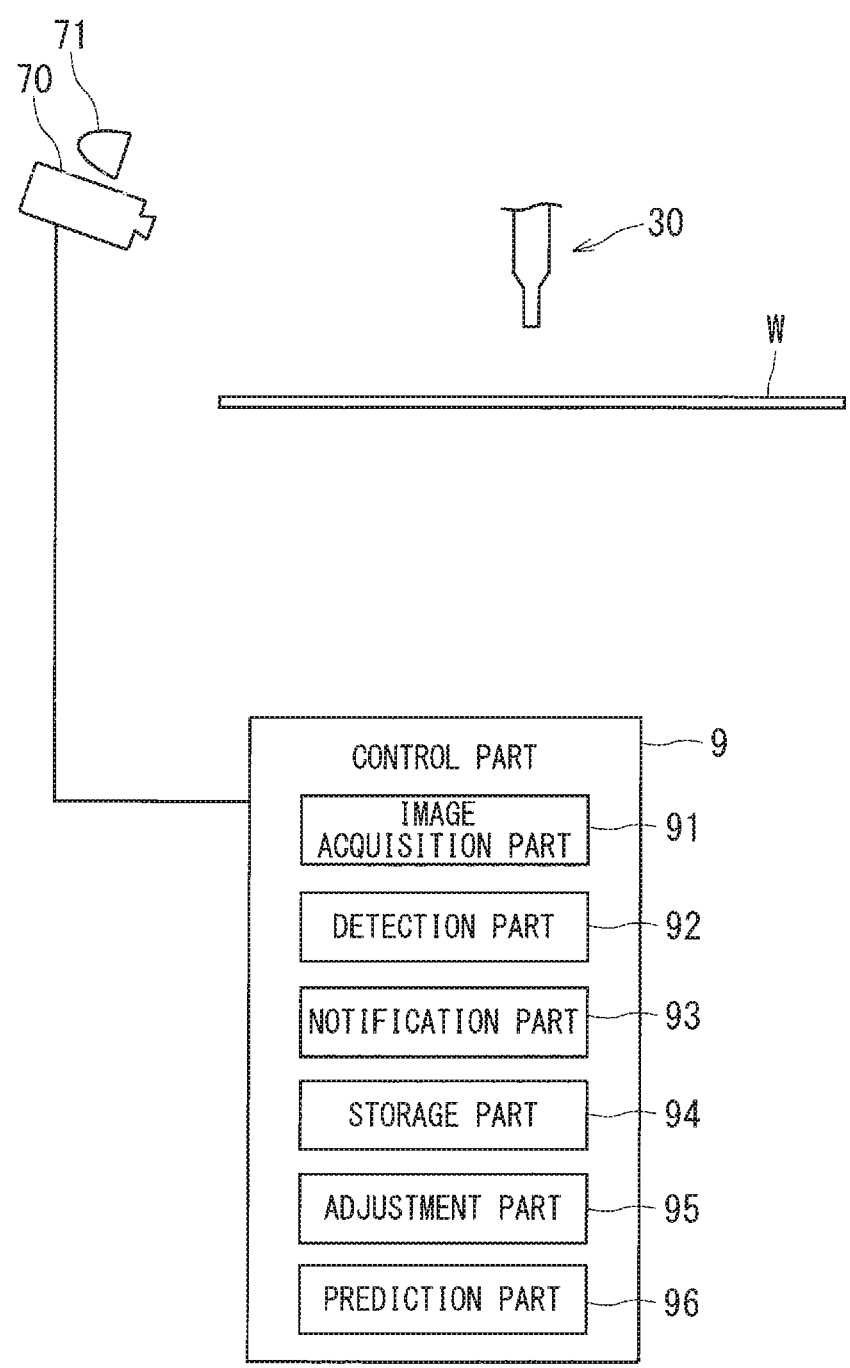
FIG. 8 is a block diagram of the imaging part and a control part.

FIG. 8 is a block diagram of the imaging part 70 and the control part 9. A configuration as hardware of the control part 9 provided in the substrate treatment device 100 is the same as that of a general computer. That is, the control part 9 is configured by including a CPU that performs various arithmetic treatment, a ROM that is a read-only memory that stores a basic program, a RAM that is a readable and writable memory that stores various pieces of information, and a magnetic disk that stores control software, data, and the like. By the CPU of the control part 9 executing a predetermined processing program, each operation mechanism of the substrate treatment device 100 is controlled by the control part 9, and the treatment in the substrate treatment device 100 proceeds.

An image acquisition part 91, a detection part 92, a notification part 93, a storage part 94, an adjustment part 95, and a prediction part 96 shown in FIG. 8 are function processing parts achieved in the control part 9 by the CPU of the control part 9 executing the predetermined processing program. As will be described in detail later, the image acquisition part 91 performs a trimming process on a plurality of images captured over time in the imaging area 80 to acquire partial images of the respective target areas 81 to 83 at each time point. The detection part 92 detects the treatment ending time point of each of the target areas 81 to 83 based on a change in luminance value for each of the target areas 81 to 83 obtained from each partial image. The notification part 93 notifies a warning to a user of the substrate treatment device 100 when an error occurs in substrate treatment. The storage part 94 is constituted by the RAM or the magnetic disk described above and stores data of an image captured by the imaging part 70, values used in each treatment, detection results by the detection part 92, and the like. The adjustment part 95 adjusts conditions of the substrate treatment based on a plurality of detection results for the substrates W stored in the storage part 94. The prediction part 96 predicts a secular change in each part of the device based on a plurality of detection results of the substrates W stored in the storage part 94.

Figure 9:
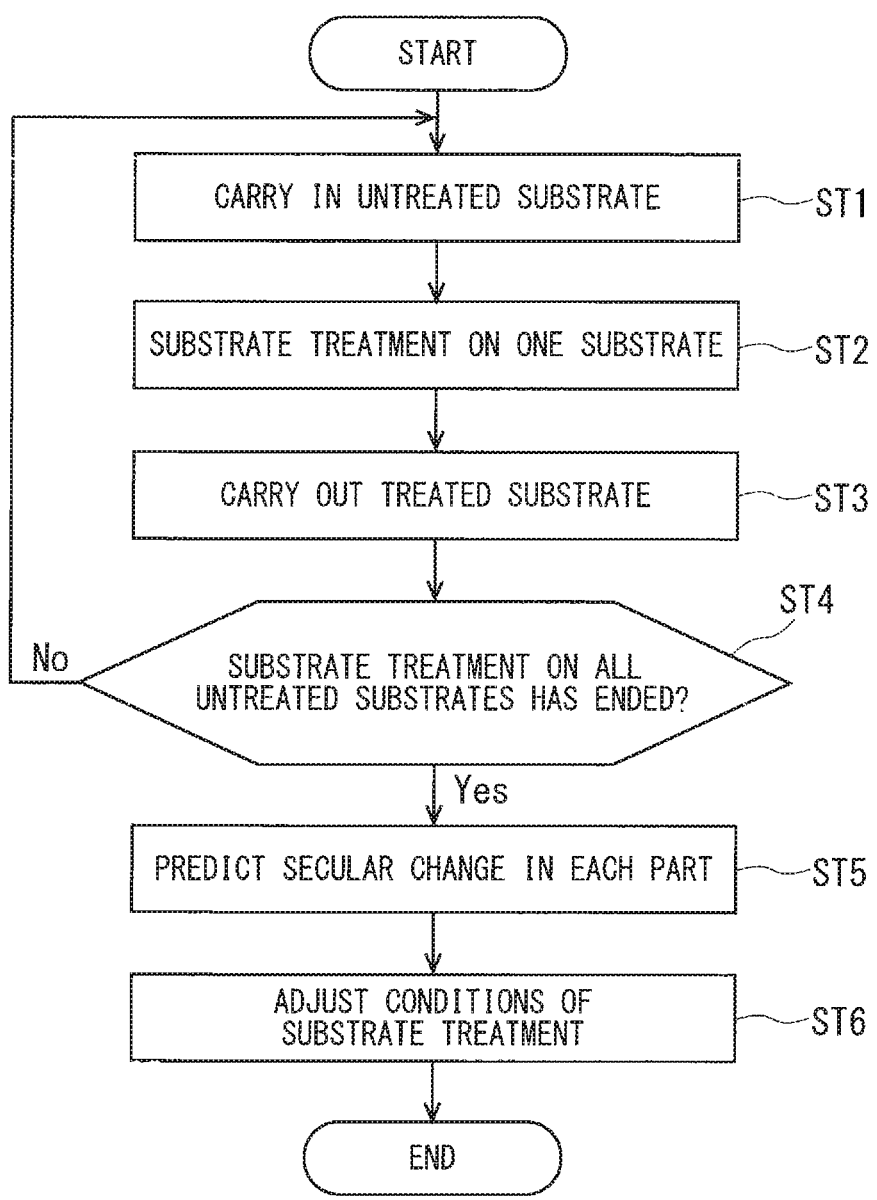
FIG. 9 is a flowchart showing an example of an operation in the substrate treatment device.

Next, the operation of the substrate treatment device 100 having the above configuration will be described. FIG. 9 is a flowchart showing an example of the operation in the substrate treatment device 100. In a normal treatment procedure of the substrate W in the substrate treatment device 100, the main transport robot 103 carries the untreated substrate W received from the indexer 102 into each treatment unit 1 (step ST1), the treatment liquid is supplied to the substrate W to treat the substrate in the treatment unit 1 (step ST2), and then the main transport robot 103 carries the treated substrate W out of the treatment unit 1 and returns the substrate W to the indexer 102 (step ST3). When the substrate treatment ends for all the untreated substrates W belonging to the same lot (step ST4), the prediction part 96 predicts a secular change in each part of the device (step ST5), and the adjustment part 95 adjusts the conditions of substrate treatment (Step ST6).

Figure 10:
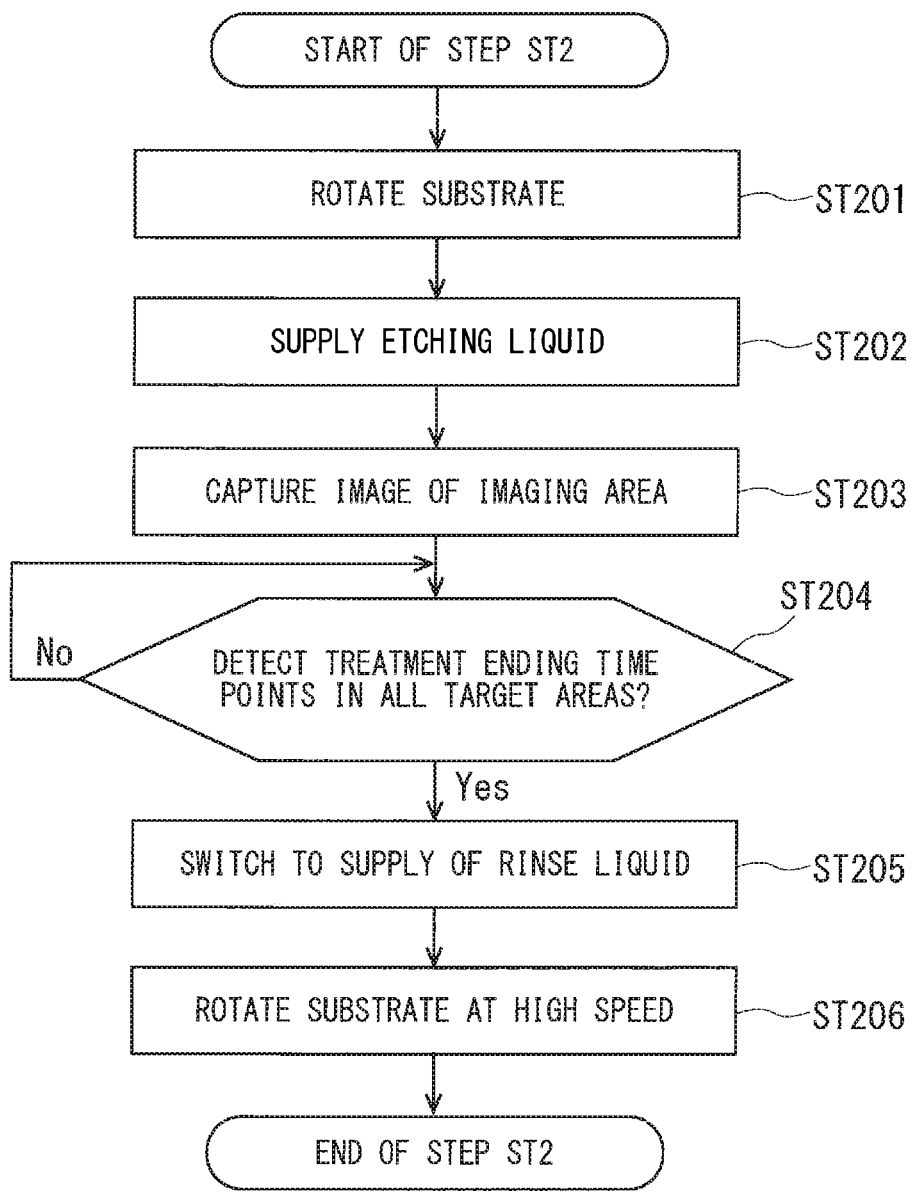
FIG. 10 is a flowchart showing an example of substrate treatment.

FIG. 10 is a flowchart showing an example of substrate treatment in step ST2. In the following, details of step ST2 and subsequent steps ST5, ST6 will be described. In the following description, a case where an etching liquid (specifically, hydrofluoric acid) is supplied as a treatment liquid from the upper surface treatment liquid nozzle 30 will be described, but the same also applies to the case of supplying other treatment liquids by using the upper surface treatment liquid nozzles 60, 65.

The substrate W carried into the treatment unit 1 is held in a horizontal posture by the spin chuck 20. After the substrate W being a new treatment target is held on the spin chuck 20, the spin motor 22 starts rotation of the spin chuck 20 and the substrate W under control of the control part 9 (substrate rotation step: step ST201).

Next, the upper surface treatment liquid nozzle 30 moves from the standby position to the treatment position, and the treatment cup 40 is lifted and lowered so as to reach the predetermined height position. The upper surface treatment liquid nozzle 30 and the treatment cup 40 are lifted and lowered by the control part 9 controlling each part in accordance with a previously set recipe (in which treatment procedure and conditions of the substrate W are described).

Then, in accordance with this recipe, the control part 9 causes the upper surface treatment liquid nozzle 30 to start discharging of the etching liquid. As a result, the etching liquid is supplied to the upper surface of the rotating substrate W (supply step: step ST202).

At the time of performing the etching treatment as thus described, the upper surface treatment liquid nozzle 30 is swung between a position above the center side of the substrate W and a position above the outer circumferential side of the substrate W by turning of the nozzle base 33. Hence the etching liquid is evenly supplied to the entire upper surface of the rotating substrate W.

Further, at the time of the etching treatment, for example, only the outer cup 43 is lifted, and between the upper end portion 43*b* of the outer cup 43 and the upper end portion 52*b* of the second guide portion 52 of the middle cup 42, an opening surrounding the substrate W held by the spin chuck 20 is formed. In this state, the substrate W is rotated together with the spin chuck 20, and the etching liquid is supplied to the upper surface of the substrate W from the upper surface treatment liquid nozzle 30. The supplied etching liquid flows along the upper surface of the substrate W by the centrifugal force generated by the rotation of the substrate W, and eventually scatters from the edge portion of the substrate W toward the side. Thereby, the etching treatment of the substrate W proceeds. The chemical liquid scattered from the edge portion of the rotating substrate W is received by the upper end portion 43b of the outer cup 43, flows down along the inner surface of the outer cup 43, and is collected in the outer collection groove 51.

After causing the discharge of the etching liquid to start, the control part 9 causes the imaging part 70 to capture an image of the imaging area 80 including the target areas 81 to 83 (imaging step: step ST203). Thus, a plurality of images (i.e., a moving image made up of a plurality of consecutive frames) captured over time in the imaging area 80 are obtained in the course of the etching treatment. Each image data captured by the imaging part 70 as shown in FIGS. 5 to 7 is stored into the storage part 94. Note that the imaging step may be started before discharge of the etching liquid is started or when the discharge of the etching liquid is started.

The image acquisition part 91 performs the trimming process on the images stored in the storage part 94 to acquire partial images of the respective target areas 81 to 83 at each time point. More specifically, coordinates corresponding to each of the target areas 81 to 83 in the imaging area 80 are set previously, the image acquisition part 91 trims the area in which the coordinates have been set to acquire each partial image, and stores the data into the storage part 94 of the control part 9.

Next, the detection part 92 refers to the imaging result of the imaging part 70 and calculates the sum or average value of luminance of pixels constituting the partial image for each of the target areas 81 to 83 at each time point (hereinafter simply referred to as luminance value). Further, the detection part 92 detects the treatment ending time point for each of the target areas 81 to 83 based on the change in the luminance value for each of the target areas 81 to 83 (detection step: step ST204).

Figure 11:
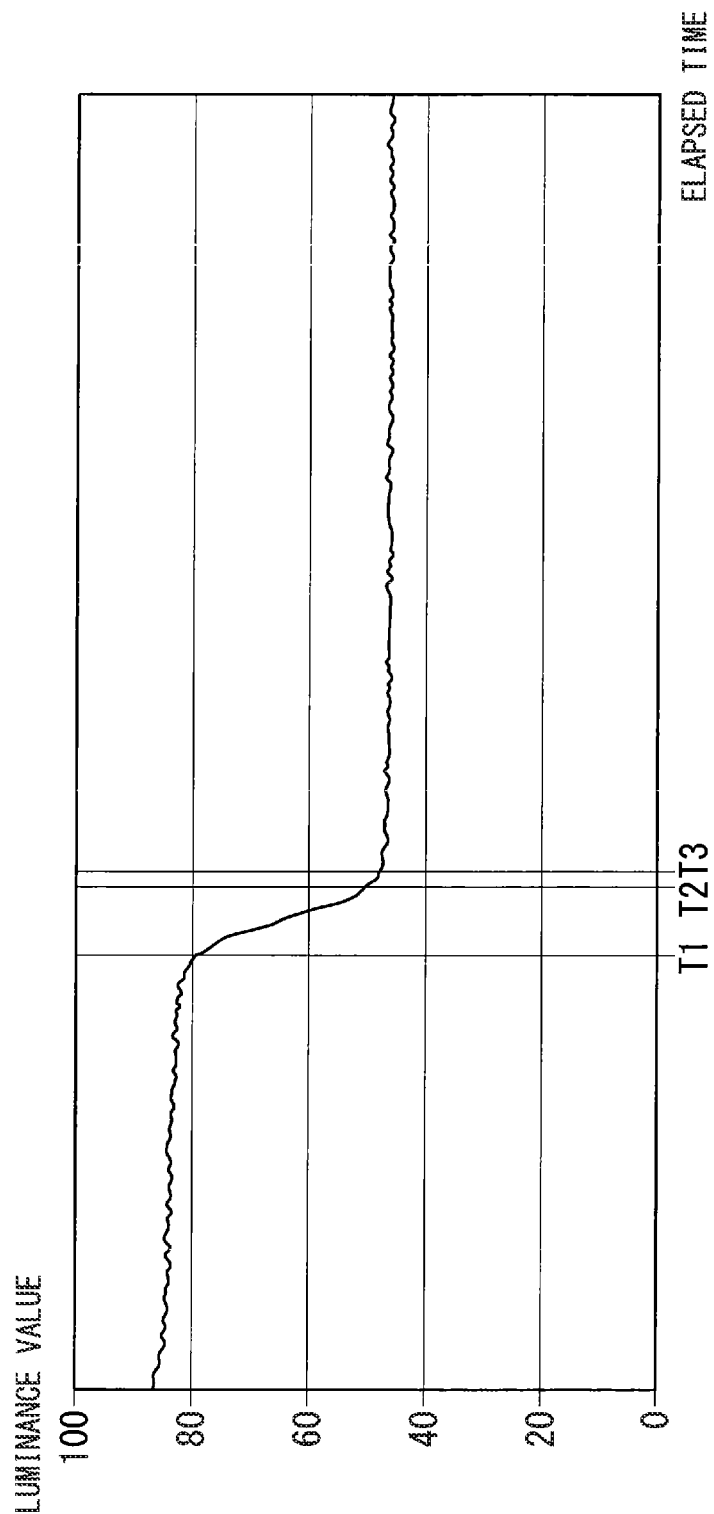
FIG. 11 is a graph showing transition of a luminance value in a plurality of consecutive frames for one target area.
Figure 12:
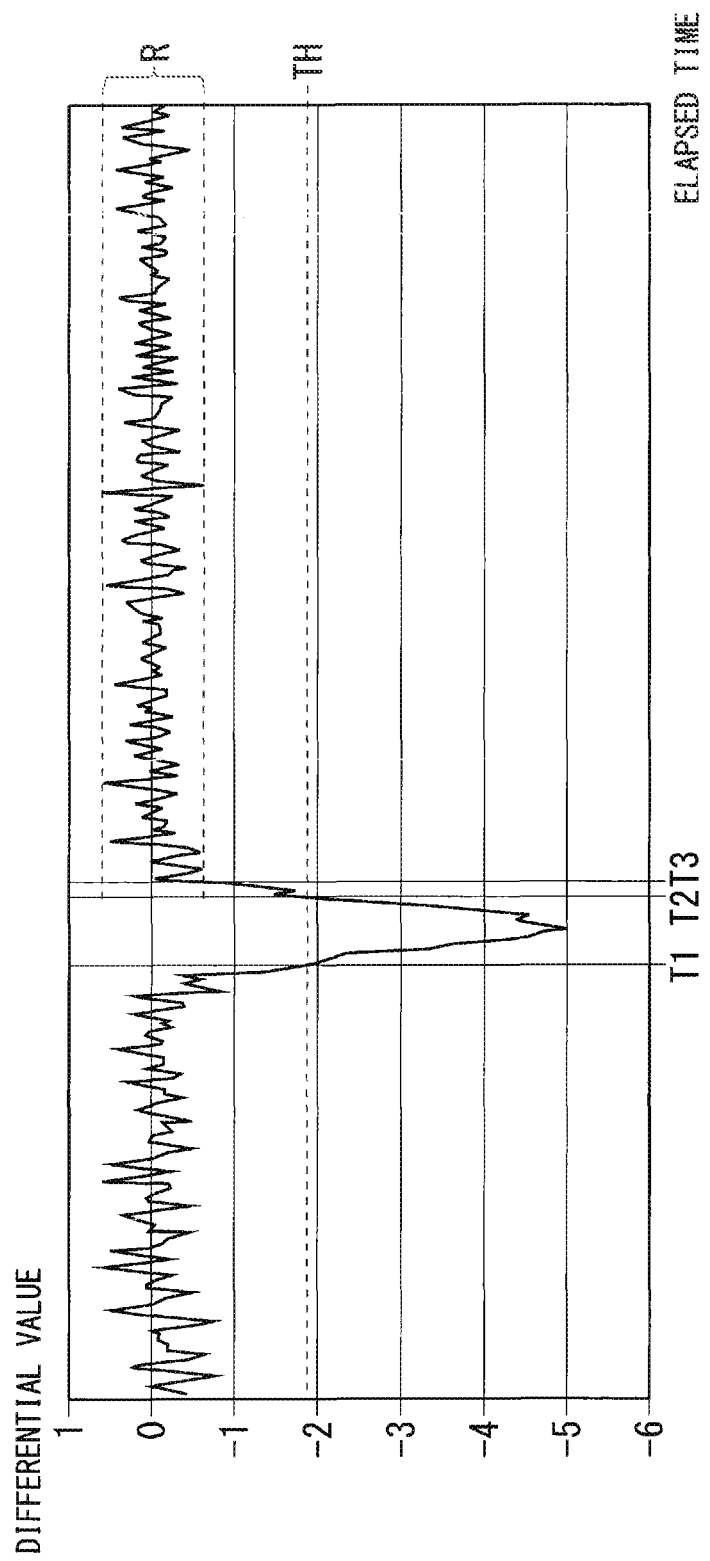
FIG. 12 is a graph showing transition of a differential value which is an amount of change in luminance value in a unit period.

Hereinafter, with reference to FIG. 11 and FIG. 12, a flow of detecting the treatment ending time point in one target area will be described. FIG. 11 is a graph showing transition of a luminance value in a plurality of consecutive frames for one target area. FIG. 12 is a graph corresponding to FIG. 11 and a graph showing transition of a differential value which is an amount of change in luminance value in a unit period.

As shown in FIG. 11, in a first period from the start of the etching treatment to the time T1, the luminance value in the target area during the etching treatment is a high value and is almost level. This first period is an initial period in which a first layer on the top side of the upper surface of the substrate W is removed by etching, and is a period in which little change is seen in the luminance value of the image acquired by the imaging part 70 due to the thickness of the remaining first layer. FIG. 5 is the image of the imaging area 80 captured during the first period.

Next, in a second period from the time T1 to the time T3, the luminance value in the target area during the etching treatment decreases gradually. This second period is a latter period in which the first layer is removed by etching, and is a period in which the luminance value of the image acquired by the imaging part 70 changes due to the influence of sufficient removal of the first layer to be etched and appearing of the second layer not to be etched which is a lower layer of the first layer. FIG. 6 is the image of the imaging area 80 captured during the second period.

Then, in a third period after the time T3, the luminance value in the target area during the etching treatment is a low value and is almost level. This third period is a period in which little change is seen in the luminance value of the image acquired by the imaging part 70 since the second layer, which is difficult to remove with the etching liquid after the removal of the first layer, becomes the imaging target. Therefore, in the example shown in FIG. 11, the time T3 corresponds to the treatment ending time point. FIG. 7 is the image of the imaging area 80 captured during the third period.

As thus described, there is a correlation between the progress of the etching treatment and the change in the luminance value, so that the detection part 92 can detect the treatment ending time point at which the etching treatment ends based on the change in the luminance value. Specifically, the detection part 92 compares differences in magnitude of the differential value, which is an amount of change in the luminance value in the unit period, and a threshold TH previously stored into the storage part 94 (see FIG. 12). Then, the detection part 92 detects a time point at which the differential value falls below the threshold TH as the time T1, and detects a time point when the differential value exceeds the threshold TH as the time T2. Further, when the fluctuation width of the differential value falls within a specific range R previously stored into the storage part 94 in a state where the differential value becomes smaller than the threshold TH and then becomes larger than the threshold TH, the detection part 92 detects a time point at which the fluctuation width falls within the range R as the time T3 (treatment ending time point). When the imaging part 70 captures an image of light applied by the illumination part 71 and reflected on the surface of the upper surface treatment liquid nozzle 30, the luminance value may be specifically increased. Therefore, when the detection part 92 detects the treatment ending time point, data processing for canceling such a specific variation in the luminance value may be performed.

The case has been described so far where the detection part 92 detects the treatment ending time point in one target area, with reference to FIGS. 11 and 12, but the same also applies to a case where the detection part 92 detects the treatment ending time point in each of the target areas 81 to 83.

FIG. 13 is a graph showing transition of a luminance value in a plurality of consecutive frames for each of the target areas 81 to 83. Note that the time t1 to the time t3 in FIG. 13 are the treatment ending time points in the target areas 81 to 83 detected by the detection part 92, respectively. That is, in the example shown in FIG. 13, the etching treatment in the target area 82 ends at the time t2, the etching treatment in the target area 81 ends at the time t1, and then the etching treatment in the target area 83 ends at the time t3.

As described above, in the present embodiment, the imaging area 80 includes the target area 81 corresponding to the center side of the upper surface of the substrate W, the target area 83 corresponding to a portion on the outer circumferential side, and the target area 82 corresponding to an intermediate portion between these target areas, and hence it is possible to grasp the treatment ending time points at three places from the center side to the outer circumferential side of the upper surface of the substrate W based on the detection result of the detection part 92.

Note that the reason why the progressing speed of the etching treatment differs at each portion of the upper surface of the substrate W is considered to be mainly due to the position and movement mode of the upper surface treatment liquid nozzle 30. In the present embodiment, the upper surface treatment liquid nozzle 30 swings between the center side and the outer circumferential side of the substrate W while discharging the etching liquid, and as compared with the center side portion or the outer circumferential side portion of the upper surface of the substrate W, the etching liquid is discharged in a relatively large amount from the upper surface treatment liquid nozzle 30 toward the intermediate portions between these side portions, so that the etching treatment is considered to proceed most quickly in the target area 82 corresponding to the intermediate portion. As another example, when the etching treatment is performed by discharging the etching liquid from the upper surface treatment liquid nozzle 30 fixed to a position above the center side of the substrate W, the etching treatment may proceed most quickly in the target area 81 corresponding to the center side portion of the substrate W.

Further, in the detection step, the treatment ending time point of each of the target areas 81 to 83 is detected based on a change in average luminance value for each of the target areas 81 to 83 averaged with a time width larger than that required for one rotation of the substrate W. Hereinafter, two methods are exemplified as such a method of acquiring the average luminance value, but the average luminance value may be acquired by another method.

The first method is a method of averaging luminance values by using a plurality of captured images. In this method, the imaging part 70 acquires a plurality of captured images with the above time width. Then, the average value of the luminance values for the target areas 81 to 83 in the captured images is used as the average luminance value for each of the target areas 81 to 83. For example, when the imaging part 70 acquires 60 captured images per second and 20 captured images are obtained with the above time width (one-third of a second), an average value of the luminance value of each of the target areas 81 to 83 in the 20 captured images is used as the average luminance value for each of the target areas 81 to 83.

The second method is a method of averaging luminance values by long-time exposure. In this method, the imaging part 70 acquires one captured image with the above time width as exposure time. The luminance value for each of the target areas 81 to 83 in the one captured image is used for the average luminance value for each of the target areas 81 to 83. For example, when the above time width is 0.2 second, the imaging part 70 acquires one captured image with the exposure time of 0.2 seconds taken as the exposure time, and an average value of the luminance value for each of the target areas 81 to 83 in the one captured image is used as the average luminance value for each of the target areas 81 to 83.

In general, a predetermined pattern is formed on the upper surface of the substrate W to be subjected to the etching treatment in a step prior to etching. Therefore, when an image of light applied by the illumination part 71 and reflected on the upper surface of the substrate W is captured by the imaging part 70, the pattern is reflected on the captured image, and the luminance value acquired from the captured image also fluctuates due to the influence of the pattern. Therefore, by using the average luminance value averaged with the time width larger than that required for one rotation of the substrate W as in the present preferred embodiment, it is possible to suppress the fluctuation of the luminance value due to the influence of the pattern and to detect the treatment ending time point with high accuracy based on the change in the luminance value. Further, in the technique of comparing the model image and the image acquired during the etching treatment as described in, for example, Japanese Patent No. 4947887, when images are averaged with a time width larger than the time required for one revolution of the substrate W, the image becomes blurred and a desired result cannot be detected. In contrast, in the technique of the present preferred embodiment, since the treatment ending time point is detected based on the change in the luminance value rather than the image having the two-dimensional information, even when the luminance value is averaged with the above time width, the treatment ending time point can be detected.

Then, until the detection part 92 detects the treatment ending time points in all the target areas 81 to 83 (until the time t3), the determination is No in step ST204 and the detection step is continued. On the other hand, when the detection part 92 detects the treatment ending time points in all the target areas 81 to 83 (after the time t3), the determination in step ST204 is Yes and the detection step ends. When the detection step ends, the detection result by the detection part 92 is stored into the storage part 94.

Thereafter, the control part 9 causes the upper surface treatment liquid nozzle 30 to stop discharging of the etching liquid and start discharging of pure water. The etching treatment is thereby switched to the pure water rinsing process, and the pure water is supplied to the upper surface of the rotating substrate W (step ST205).

At the time of performing the pure water rinsing process as thus described, the upper surface treatment liquid nozzle 30 is swung between a position above the center side of the substrate W and a position above the outer circumferential side of the substrate W by turning of the nozzle base 33. Hence the pure water is evenly supplied to the entire upper surface of the rotating substrate W.

When the pure water rinsing process is performed, for example, all of the inner cup 41, the middle cup 42, and the outer cup 43 are lifted, and the substrate W held by the spin chuck 20 is surrounded by the first guide portion 47 of the inner cup 41. In this state, the substrate W is rotated together with the spin chuck 20, and the pure water is supplied to the upper surface and the lower surface of the substrate W from the upper surface treatment liquid nozzle 30 and the lower surface treatment liquid nozzle 28. The supplied pure water flows along the upper surface and the lower surface of the substrate W by the centrifugal force generated by the rotation of the substrate W, and eventually scatters from the edge portion of the substrate W toward the side. As a result, the pure water rinsing process on the substrate W proceeds. The pure water scattered from the edge portion of the rotating substrate W flows down along the inner wall of the first guide portion 47 and is discharged from the drainage groove 49. When the pure water is collected by a separate route from the chemical liquid, the middle cup 42 and the outer cup 43 are lifted so that an opening surrounding the substrate W held by the spin chuck 20 may be formed between the upper end portion 52b of the second guide portion 52 of the middle cup 42 and the upper end portion 47b of the first guide portion 47 of the inner cup 41.

In the present preferred embodiment, the etching treatment is monitored in real time by the imaging part 70, the detection part 92 detects the treatment ending time points in all the target areas 81 to 83, and thereafter, the supply of the etching liquid is stopped. Therefore, it is possible to prevent insufficient etching treatment (so-called under-etching) on the first layer to be removed by using the etching liquid. With the under-etching leading to reduction in yield, in the technique of the present preferred embodiment, it is possible to improve the yield by preventing the under-etching.

Further, in the present preferred embodiment, instead of the mode in which the etching liquid is supplied for a certain period of time defined by the recipe, at the time point when the detection part 92 detects the treatment ending time points in all the target areas 81 to 83, the determination in the step ST204 is Yes, and the supply of the etching liquid is stopped. Therefore, it is possible to suppress excessive etching treatment (so-called over-etching) on the second layer (layer not to be removed by using the etching liquid) even after removal of the first layer. In recent years, as the pattern formed on the substrate W has been miniaturized, there has been a concern that the yield may be lowered also in the case of over-etching, and in the technique of the present preferred embodiment, it is possible improve the yield by suppressing the over-etching.

Generally, in the etching treatment, the under-etching is more likely to lead to a lower yield than the over-etching. In addition, due to a difference in the thickness of the first layer among each substrate W, and the like, there is a problem that the appropriate supply time of the etching liquid is different for each substrate W. Therefore, typically, when the supply time of the etching liquid is defined by the recipe, longer time than the time in which the etching treatment is assumed to end is defined as the supply time for the purpose of preventing the under-etching on any substrate W. In contrast, in the present preferred embodiment, the etching treatment ends at an early stage by detecting the treatment ending time point, so that the use amount of the etching liquid can be suppressed.

The supply time of the pure water after the etching treatment may be, for example, a certain period of time defined by the recipe or a variable time so that the total supply time of the etching liquid and the pure water becomes constant. In the former case, the treated substrate W can be carried out of the treatment unit 1 by the time shortened by the etching treatment, and the throughput can be improved. In the latter case, even when the etching treatment time differs for each substrate W, the treated substrate W can be carried out of the treatment unit 1 at prescribed timing without being affected by the etching treatment time, to facilitate control of a schedule for operation in each part of the substrate treatment device 100.

When the pure water rinsing process ends, the control part 9 causes the upper surface treatment liquid nozzle 30 to stop discharging of the pure water and move to the standby position. Further, the control part 9 controls the spin motor 22 so as to increase the rotational speed of the substrate W. As a result, a spin-drying process is performed to rotate the substrate W at a high speed to dry the substrate W (step ST206).

When the spin-drying process is performed, all of the inner cup 41, the middle cup 42, and the outer cup 43 are lowered, and any of the upper end portion 47b of the first guide portion 47 of the inner cup 41, the upper end portion 52b of the second guide portion 52 of the middle cup 42, and the upper end portion 43b of the outer cup 43 is positioned below the substrate W held by the spin chuck 20. In this state, the substrate W is rotated at a high speed together with the spin chuck 20, and water droplets adhered to the substrate W are spun off by centrifugal force. In this manner, the substrate treatment (step ST2) for one substrate W ends.

Returning to FIG. 9, when the substrate treatment on all the untreated substrates W ends (step ST4), the prediction part 96 refers to the detection results for the substrates W stored in the storage part 94, and based on the detection results, the prediction part 96 predicts a secular change in each part of the substrate treatment device 100 (prediction step: step ST5). For example, the prediction part 96 refers to a treatment ending time point C of each target areas 81 to 83 for a plurality of lots along the treatment order, confirms whether the process is being stably executed by the substrate treatment device 100, and determines whether there is a sign of an operation abnormality. FIG. 9 illustrates that the prediction step is executed every time the substrate treatment on one lot ends, but the prediction step may be executed every time a specific operation is performed before and after a chemical liquid exchange operation, before and after a maintenance operation, and the like.

The adjustment part 95 refers to a plurality of detection results for the substrates W stored in the storage part 94, and adjusts conditions of the substrate treatment based on the detection result (adjustment step: step ST6). For example, the adjustment part 95 refers to a difference in the treatment ending time points among each of the target areas 81 to 83 for the same substrate W and changes the recipe for the purpose of reducing the difference. Specifically, the adjustment part 95 performs an optimization process of reducing the difference by changing the recipe for the swing width, a swing speed, a discharge flow rate, or the like of the upper surface treatment liquid nozzle 30.

FIG. 14 is a graph showing transition of a luminance value in a plurality of consecutive frames for each of the target areas 81 to 83. Note that the time t1 to the time t3 in FIG. 14 are the treatment ending time points in the target areas 81 to 83, detected by the detection part 92, respectively. That is, in the example shown in FIG. 14, the etching treatment in each of the target areas 81 to 83 ends at the time t1 to the time t3 which are the same time. The optimization in the adjustment step means, for example, as shown in FIG. 14, that a difference in the treatment ending time point among each of the target areas 81 to 83 is zero. Although FIG. 9 illustrates that the adjustment step is executed after the prediction step, this order is not essential, and the adjustment step may be executed without performing the prediction step.

<Modifications>

Although the preferred embodiment of the present invention has been described above, various modifications can be made other than those described above without departing from the gist of the present invention.

FIG. 15 is a flowchart showing an example of substrate treatment according to a modification. In the treatment example shown in FIG. 15, steps ST211 to ST213 are performed in the same manner as steps ST201 to ST203 of the treatment example shown in FIG. 10. However, in the treatment example shown in FIG. 15, unlike the treatment example shown in FIG. 10, the etching treatment is switched to the pure water rinsing process at the time point when the etching liquid is supplied for a certain period of time defined by the recipe regardless of the detection result of the detection part 92 (step ST214). Then, it is determined whether or not the etching treatment is switched to the pure water rinsing process before the detection part 92 detects the treatment ending time point of each of the target areas 81 to 83 (step ST215). If the detection part 92 has not detected the treatment ending time point of each of the target areas 81 to 83 when the supply of the etching liquid is stopped, the notification part 93 notifies the warning (notification step: step ST216). As a notification mode, for example, an error is displayed on a display attached to the control part 9. In addition, when the etching treatment is switched to the pure water rinsing process after the detection part 92 detects the treatment ending time point of each of the target areas 81 to 83, the notification part 93 does not perform notification, and the step ST2 ends. As thus described, in the treatment example shown in FIG. 15, it is possible to identify the substrate W having the possibility of under-etching while successively performing the etching treatment on a plurality of substrates W of the same lot in accordance with the recipe.

In the above preferred embodiment, the case where the etching liquid is used as the treatment liquid has been described, but the present invention is also applicable to a case where another chemical liquid (e.g., peeling liquid, etc.) is used as the treatment liquid. By using the present invention, it is possible to grasp the treatment ending time point on each of the center side and the outer circumferential side of the surface to be treated, so that the present invention is particularly effective for treatment in which excess or insufficient treatment time becomes problematic as in the etching treatment.

In the above-described preferred embodiment, the aspect in which the imaging area 80 includes three target areas 81 to 83 has been described, but the present invention is not limited thereto. The imaging area may only include at least an area on the center side and an area on the outer circumferential side of the surface to be treated as the target areas, and the number of the target areas may be two or four or more. The size and exposure of each target area can also be set as appropriate.

In the above preferred embodiment, the case where the luminance value decreases in the course of the etching treatment has been described, but the present invention can be applied even when the luminance value is improved in the course of the etching treatment. In this case, the detection part compares differences in magnitude between a differential value, which is an amount of change in the luminance value in a unit period, and a threshold and detects the treatment ending time point based on a result of the comparison. More specifically, when the fluctuation width of the differential value falls within a specific range in a state where the differential value becomes larger than the threshold and then becomes smaller than the threshold, the detection part can detect a time point at which the fluctuation width falls within the range as the treatment ending time point.

Further, in the above preferred embodiment, the case of using the imaging result acquired by one imaging part 70 has been described, but imaging results acquired by a plurality of imaging parts may be used.

In addition, the substrate to be treated by the substrate treatment device 100 is not limited to the substrate for semiconductor use, but may be a glass substrate used for a substrate for solar cell use or a flat panel display such as a liquid-crystal display. The present invention may be applied with the lower surface of the substrate W as the surface to be treated.

Although the substrate treatment device and the substrate treatment method according to the preferred embodiment and its modifications have been described above, these are examples of preferred embodiments of the present invention and do not limit the scope of the present invention. In the present invention, it is possible to freely combine each preferred embodiment, modify an optional component of each preferred embodiment, or omit optional components in each preferred embodiment within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment device comprising:
a substrate rotation part that horizontally holds and rotates a substrate;
a nozzle that supplies a treatment liquid to a surface to be treated of said substrate rotated by said substrate rotation part;
an imaging part that captures an image of an imaging area including a plurality of target areas in which a liquid film of said surface to be treated is formed when said treatment liquid is supplied to said substrate; and
a detection part that refers to an imaging result of said imaging part and detects a treatment ending time point of each of said plurality of target areas based on a change in luminance value for each of said plurality of target areas,
wherein said imaging area includes at least an area on a center side of said surface to be treated and an area on an outer circumferential side of said surface to be treated as said plurality of target areas.

2. The substrate treatment device according to claim 1, wherein said detection part compares differences in magnitude between a differential value of said luminance value and a threshold and detects said treatment ending time point based on a result of the comparison.

3. The substrate treatment device according to claim 2, wherein when a fluctuation width of said differential value falls within a specific range in a state where said differential value becomes larger than said threshold and then becomes smaller than said threshold or in a state where said differential value becomes smaller than said threshold and then becomes larger than said threshold, said detection part detects a time point at which said fluctuation width falls within said range as said treatment ending time point.

4. The substrate treatment device according to claim 1, wherein said detection part detects said treatment ending time point of each of said plurality of target areas based on a change in average luminance value for each of said plurality of target areas, the average luminance value being averaged with a time width larger than time required for one rotation of said substrate.

5. The substrate treatment device according to claim 4, wherein
said imaging part acquires a plurality of captured images with said time width, and
said average luminance value is an average value of said luminance value for each of said plurality of target areas in said plurality of captured images.

6. The substrate treatment device according to claim 4, wherein
said imaging part acquires one captured image with said time width taken as an exposure time, and
said average luminance value is an average value of said luminance value for each of said plurality of target areas in said one captured image.

7. The substrate treatment device according to claim 1, wherein the supply of said treatment liquid by said nozzle is stopped when said detection part detects said treatment ending time point of each of said plurality of target areas.

8. The substrate treatment device according to claim 1, further comprising a notification part that notifies a warning when said detection part has not detected said treatment ending time point of each of said plurality of target areas upon stopping of the supply of said treatment liquid by said nozzle.

9. The substrate treatment device according to claim 1, further comprising an adjustment part that adjusts a condition of substrate treatment based on a detection result of said detection part when a plurality of said substrates are treated with said treatment liquid.

10. The substrate treatment device according to claim 1, further comprising a prediction part that predicts a secular change in each part of the device based on a detection result of said detection part when a plurality of said substrates are treated with said treatment liquid.

11. The substrate treatment device according to claim 1, wherein said treatment liquid is an etching liquid.

12. A substrate treatment method comprising:
a substrate rotation step of horizontally holding and rotating a substrate;
a supply step of supplying a treatment liquid to a surface to be treated of said substrate rotated by said substrate rotation step;
an imaging step of capturing an image of an imaging area including a plurality of target areas in which a liquid film of said surface to be treated is formed when said treatment liquid is supplied to said substrate; and
a detection step of referring to an imaging result in said imaging step and detecting a treatment ending time point of each of said plurality of target areas based on a change in luminance value for each of said plurality of target areas,
wherein said imaging area includes at least an area on a center side of said surface to be treated and an area on an outer circumferential side of said surface to be treated as said plurality of target areas.

13. The substrate treatment method according to claim 12, wherein in said detection step, differences in magnitude between a differential value of said luminance value and a threshold are compared, to detect said treatment ending time point based on a result of the comparison.

14. The substrate treatment method according to claim 13, wherein when a fluctuation width of said differential value falls within a specific range in a state where said differential value becomes larger than said threshold and then becomes smaller than said threshold or in a state where said differential value becomes smaller than said threshold and then becomes larger than said threshold, a time point at which said fluctuation width falls within said range is detected as said treatment ending time point in said detection step.

15. The substrate treatment method according to claim 12, wherein in said detection step, said treatment ending time point of each of said plurality of target areas is detected based on a change in average luminance value for each of said plurality of target areas, the average luminance value being averaged with a time width larger than time required for one rotation of said substrate.

16. The substrate treatment method according to claim 15, wherein
in said imaging step, a plurality of captured images are acquired with said time width, and
said average luminance value is an average value of said luminance value for each of said plurality of target areas in said plurality of captured images.

17. The substrate treatment method according to claim 15, wherein
in said imaging step, one captured image is acquired with said time width taken as an exposure time, and
said average luminance value is an average value of said luminance value for each of said plurality of target areas in said one captured image.

18. The substrate treatment method according to claim 12, wherein said supply step is stopped when said treatment ending time point of each of said plurality of target areas is detected in said detection step.

19. The substrate treatment method according to claim 12, further comprising a notification step of notifying a warning when said treatment ending time point of each of said plurality of target areas has not been detected by said detection step upon stopping of said supply step.

20. The substrate treatment method according to claim 12, further comprising an adjustment step of adjusting a condition of substrate treatment based on a plurality of detection results by said detection step when a plurality of said substrates are treated with said treatment liquid.

21. The substrate treatment method according to claim 12, further comprising a prediction step of predicting a secular change in each part of the device based on a plurality of detection results by said detection step when a plurality of said substrates are treated with said treatment liquid.

22. The substrate treatment method according to claim 12, wherein said treatment liquid is an etching liquid.

* * * * *